United States Patent [19]
Shinogi et al.

[11] Patent Number: 6,158,283
[45] Date of Patent: *Dec. 12, 2000

[54] SEMICONDUCTOR ACCELERATION SENSOR

[75] Inventors: Masataka Shinogi; Yutaka Saitoh; Kenji Kato, all of Chiba, Japan

[73] Assignee: Seiko Instruments R&D Center Inc., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/798,290

[22] Filed: Feb. 7, 1997

[30] Foreign Application Priority Data

Feb. 28, 1996 [JP] Japan ................................. 8-041933

[51] Int. Cl.[7] ................................................. G01P 15/12
[52] U.S. Cl. ..................................................... 73/514.33
[58] Field of Search ........................ 73/514.16, 514.36, 73/514.34, 774, 777, 514.33; 338/2, 5, 13, 43; 257/417

[56] References Cited

U.S. PATENT DOCUMENTS

| | | | |
|---|---|---|---|
| 3,965,453 | 6/1976 | Seidel et al. | 338/13 |
| 4,688,434 | 8/1987 | Cherbuy | 73/862.65 |
| 4,969,359 | 11/1990 | Mikkor | 73/517 R |
| 5,081,867 | 1/1992 | Yamada | 73/517 R |
| 5,170,665 | 12/1992 | Janiaud et al. | 73/517 AV |
| 5,415,044 | 5/1995 | Yamamoto | 73/514.33 |
| 5,606,128 | 2/1997 | Araki | 73/514.16 |
| 6,005,275 | 12/1999 | Shinogi et al. | 257/417 |

FOREIGN PATENT DOCUMENTS

| | | |
|---|---|---|
| 261555A2 | 3/1988 | European Pat. Off. . |
| 306178A2 | 3/1989 | European Pat. Off. . |
| 340476A1 | 11/1989 | European Pat. Off. . |
| 459723A2 | 12/1991 | European Pat. Off. . |
| 528551A2 | 2/1993 | European Pat. Off. . |
| 675363A2 | 10/1995 | European Pat. Off. . |
| 2725028 | 3/1996 | France . |
| 3-170266 | 7/1991 | Japan . |
| 7-122759 | 5/1995 | Japan . |
| WO8900294 | 1/1989 | WIPO . |

*Primary Examiner*—Richard A. Moller
*Attorney, Agent, or Firm*—Adams & Wilks

[57] ABSTRACT

A semiconductor acceleration sensor comprises a cantilever structure formed from a semiconductor wafer and having a first surface for receiving an acceleration force, a second surface disposed generally orthogonal to the first surface, and strain sensing portions disposed on the second surface. A supporting body supports the cantilever structure. A plurality of bridge circuits are disposed on the second surface of the rectangular parallelepiped shaped structure. Each of the bridge circuits has a plurality of the strain sensing portions.

17 Claims, 23 Drawing Sheets

FIG. 1
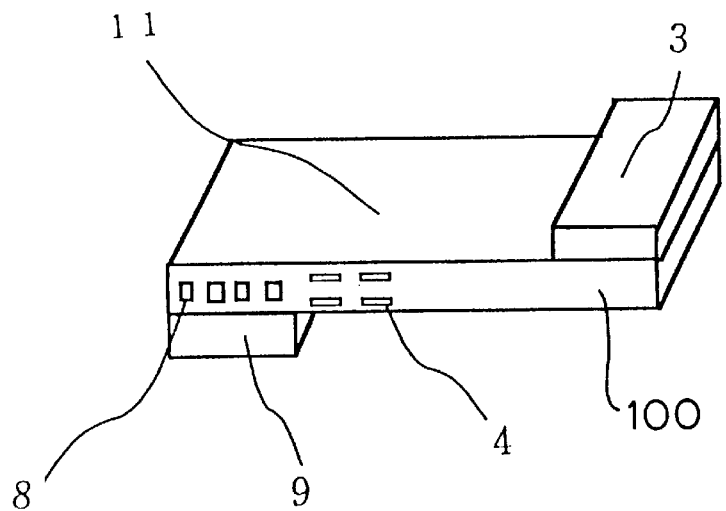
FIG. 2A
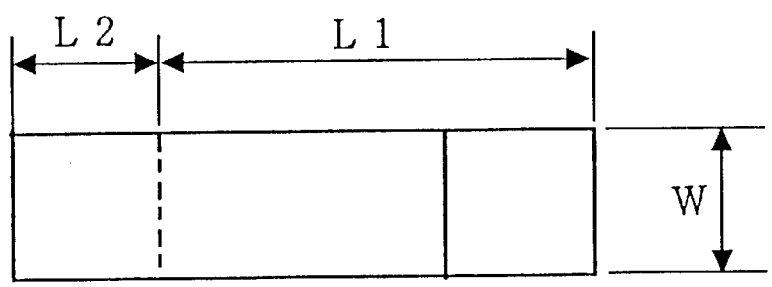
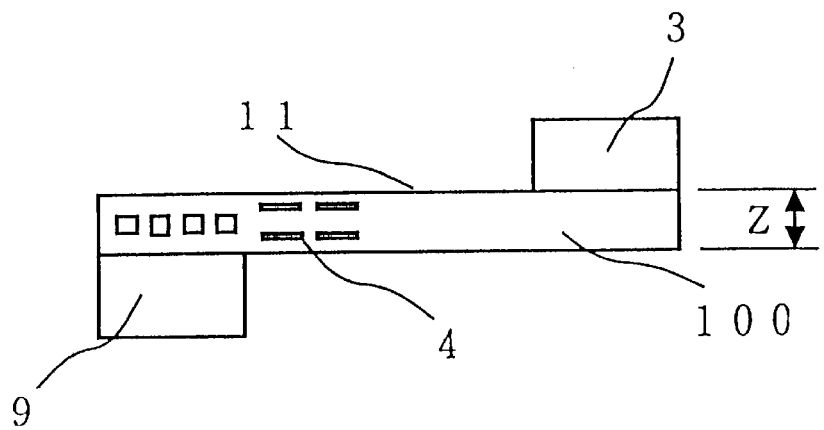
FIG. 2B

1st Step

2nd Step

3rd Step

FIG. 22
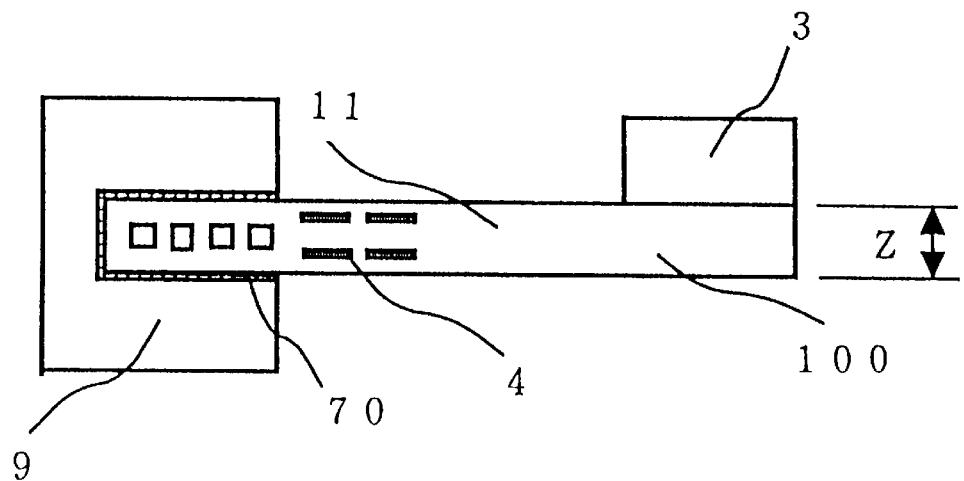
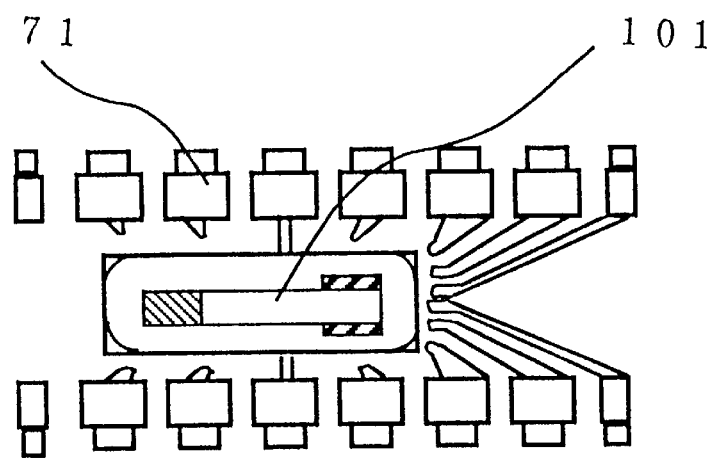
FIG. 23A
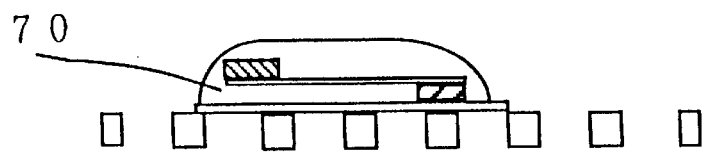
FIG. 23B
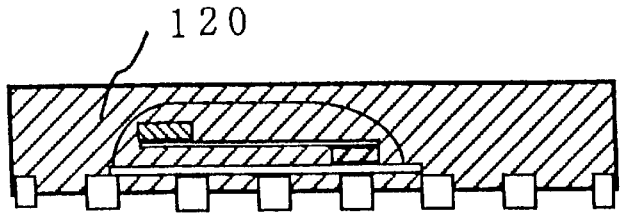
FIG. 23C

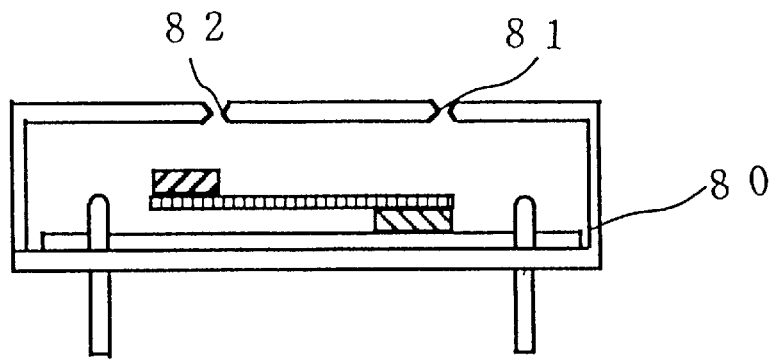
FIG. 25A
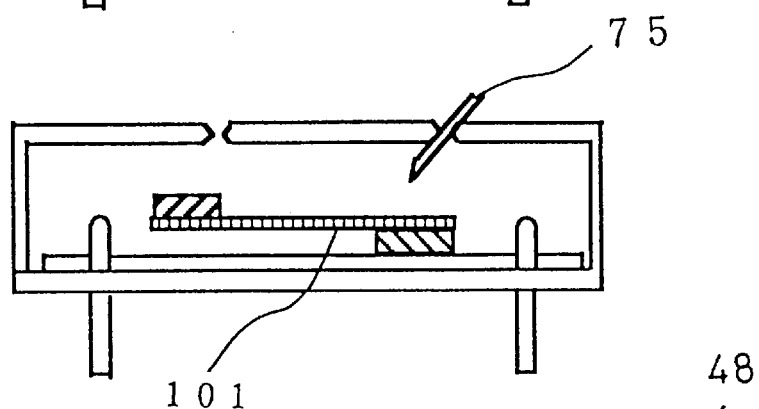
FIG. 25B
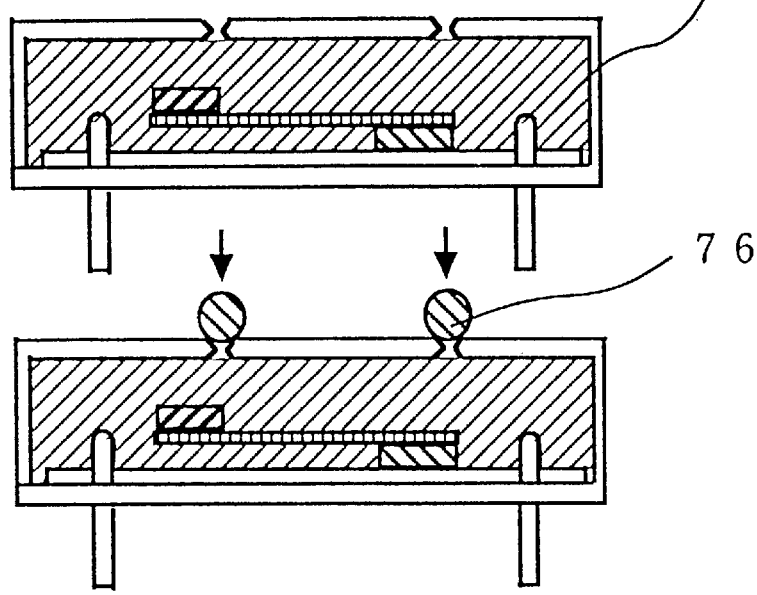
FIG. 25C
FIG. 25D
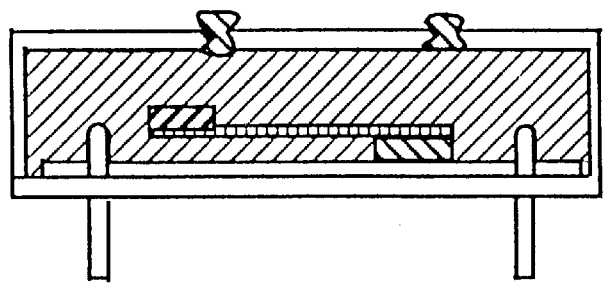
FIG. 25E

SEMICONDUCTOR ACCELERATION SENSOR

BACKGROUND OF THE INVENTION

The present invention particularly relates to an acceleration sensor and a pressure sensor in a semiconductor device for converting a displacement into electric signals by utilizing piezoresistance effect inherent to a semiconductor crystal such as silicon.

With the recent development of micro machining technology, a semiconductor acceleration sensor has been manufactured by means of film formation or etching on a semiconductor wafer. (See IEEE Transactions on Electron Devices, Vol. ED)-26, No. 12, December 1979, for example.) FIGS. 3A and 3B are views showing a prior art semiconductor acceleration sensor manufactured according to micro machining technology, wherein FIG. 3A is a top plan view and FIG. 3B is a cross-sectional view. A silicon substrate I is etched to form a cantilever 2 and a dead-weight 3. Here, the cantilever 2 is made thinner than any other portion by etching and deformed with acceleration in a direction indicated by an arrow in FIG. 3B. A quantity of deformation of the cantilever 2 is detected by the piezoresistance effect of a diffused resistor 4a formed on the upper surface of the cantilever 2, and the acceleration is obtained by comparing the obtained quantity with that from a diffused resistor 4b. Here, the diffused resistors 4a and 4b are connected with highly diffused areas 5 and output terminals 8. Further, an upper stopper 6 and a lower stopper 7 are disposed to prevent damage of the cantilever 2, and the overall system is provided on a ceramic board 10.

FIG. 4A is a view showing a semiconductor acceleration sensor according to micro machining technology disclosed in Japanese patent laid-open publication No. 1-302167, wherein a groove portion 35 is formed in the vicinity of a supporting body 9 of the cantilever 2 by etching to provide a thin portion 36. Diff-used resistors 4c, 4d, 4e and 4f are provided on the top face of the sensor to constitute a bridge circuit 50. The diffused resistors 4c and 4f function as reference resistors and are provided on the top face of the supporting body 9. The diffused resistors 4d and 4e function as variable resistors for detecting a quantity of deformation of the thin portion 36 and are provided at positions orthogonal to the reference resistors. FIG. 4B shows a detection circuit of the device shown in FIG. 4A.

In the prior art semiconductor acceleration sensor, the thin portion 36 shown in FIG. 4A must be formed in order to improve detection sensitivity, thereby deteriorating the overall mechanical strength.

Here, the thickness of the thin portion 36 relates to detection sensitivity, and conditions for composition, temperature and stirring of etchant must be strictly managed in order to obtain an uniform thickness when forming the thin portion 36 by etching, increasing manufacturing steps such as masking pattern formation.

Furthermore, an area of the top surface of the acceleration sensor becomes large, a number of sensors taken out from, e.g., one silicon substrate is limited and the manufacturing cost is hard to be reduced because the diffused resistors 4a and 4b are provided on the top surface of the acceleration sensor and the dead-weight 3 is formed as shown in FIG. 3A. A predetermined value is required for a width of the cantilever 2, i.e., the width from the front side to the other side in the drawing in order to maintain the strength of the thin portion 36 in the acceleration sensor in FIG. 4A. Therefore, an area of the top face of the sensor can not be reduced as in the acceleration sensor shown in FIG. 3A to limit a number of sensors taken out from the semiconductor wafer, and the cost down is difficult.

In addition, since the diffused resistors 4 for detecting the acceleration are provided on a surface to which acceleration of the acceleration sensor is applied, the diffused resistors 4 must be so disposed as to enlarge a difference in resistance value between the reference resistors and the variable resistors provided on the top face of the supporting body 9.

In order to eliminates these problems, it is therefore an object of the present invention is to obtain inexpensive semiconductor acceleration sensor and pressure sensor with which manufacturing is facilitated and a large number of sensors can be produced from one semiconductor wafer.

SUMMARY OF THE INVENTION

To this end, according to the present invention, diffused resistors 4 are provided on the side surface of a sensor in order to produce a large number of sensors from one semiconductor wafer. In this manner, provision of a detection means for detecting a quantity of displacement on the side surface of the sensor can obtain a highly-accurate inexpensive sensor with the reduced number of processing steps using no etching process.

A semiconductor device which has a good yield and a semiconductor acceleration sensor can be supplied.

Further, easy manufacturing is possible with a good yield in accordance with arrangement of diffused resistors, a fixation method and a wire connection method.

BRIEF DESCRIPTION OF THE DRAWINGS

In order to more fully understand the drawings used in the detailed description of the present invention, a brief description of each drawing is provided.

FIG. 1 is a perspective view showing the structure of a semiconductor acceleration sensor according to the present invention;

FIG. 2A is a top plan view showing the structure of the semiconductor acceleration sensor according to the present invention, and FIG. 2B is a side view showing the structure of the semiconductor acceleration sensor according to the present invention;

FIG. 22 is an explanatory view used for explaining a fixing method using gel according to the present invention;

FIGS. 23A–23C are explanatory views used for explaining a package in which gel is used for reducing impact resistance according to the present invention;

FIGS. 25A–25E are process diagrams showing a packaging method according to the present invention;

DETAILED DESCRIPTION OF THE PREFERRED EMBODIMENTS

Figure 3A:
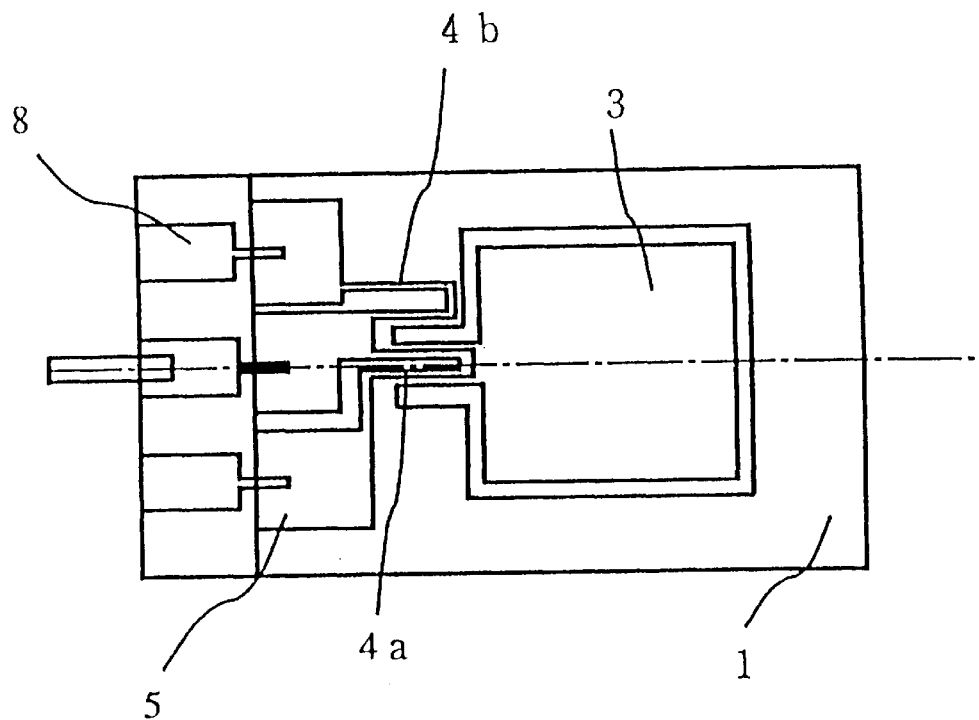
FIG. 3A is a top plan view showing the structure of the prior art semiconductor acceleration sensor.

An embodiment according to the present invention will now be described with reference to FIG. 1.

FIG. 1 is a perspective view showing a semiconductor acceleration sensor according to the present invention.

A semiconductor substrate 11 has a rectangular parallelopiped shape, and diffused resistors 4 and output terminals 8 electrically connected with the diffused resistors 4 are disposed on a side surface 100 that is one surface of the semiconductor substrate 11. Here, an amplification circuit, a temperature compensation circuit or a filter circuit may be provided on the side surface 100 in the semiconductor substrate 11. Also, they may be provided on any other form of the device.

The semiconductor substrate 11 has the diffused resistors 4 constituted by a bridge circuit 50 on one side thereof and formed into a rectangular parallelopiped type structure.

This rectangular parallelopiped type structure is manufactured by being cut out from the semiconductor wafer 12 having the diffused resistors 4. In regard of the taken-out device, the thickness of the semiconductor wafer 12 corresponds to a surface orthogonal to a surface of the rectangular parallelopiped on which the diffused resistors are provided.

The surface of the semiconductor wafer 12 on which the diffused resistors 4 are formed corresponds to the side surface 100 after being cut out.

FIG. 2A is a top plan view of the semiconductor acceleration sensor and FIG. 2B is a side view of the same. Although the semiconductor substrate 11 can be formed into various shapes, it is effective when formed into a rectangular parallelopiped because it can be easily taken out from the semiconductor wafer 12. Moreover, if the thickness Z of the semiconductor substrate 11 is made smaller than the width W of the semiconductor substrate 11, the detection sensitivity can be increased. Note that a portion L2 at which the supporting body 9 and the semiconductor substrate 11 are fixed is a supporting portion and a portion L1 at which these members are not fixed and oscillation is possible is a sensor portion, and these names will be used hereinbelow.

Further, the configuration made up of the semiconductor substrate 11, the supporting body 9 and the dead-weight 3 shown in FIG. 2 will be referred to as a semiconductor acceleration sensor device.

Embodiment 1

Figure 13:
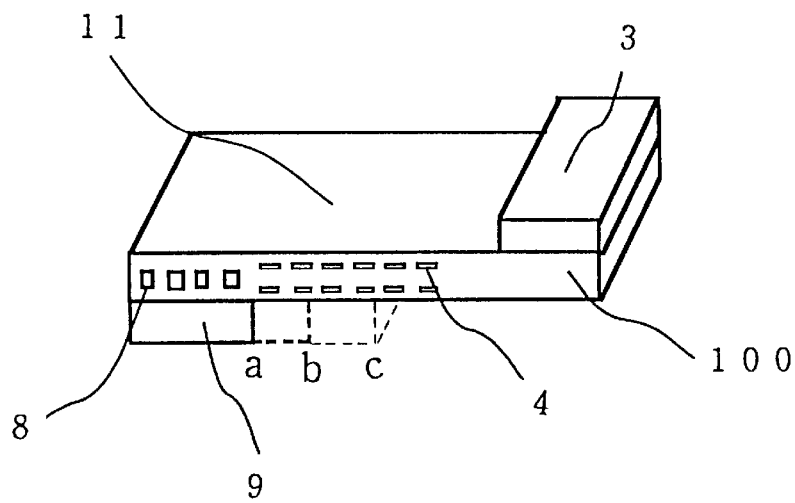
FIG. 13 is a perspective view of the semiconductor acceleration sensor to which a plurality of bridge circuits are provided according to the present invention.

A plurality of bridge circuits are arranged to a rectangular parallelopiped type structure on a surface having strain sensing portions. FIG. 13 shows the case where multiple bridge circuits are disposed. The strain sensing portions are a portion on which diffused resistors or the like whose resistance values vary in response to strain or stress are formed.

According to the structure of this embodiment, a function as a pressure sensor can be obtained by fixing the both ends.

When a plurality of the circuits are provided, sensitivity can be readily adjusted by changing a position at which the supporting body 9 is provided. In case of an air bag sensor for lifesaving when cars have a collision, a sensitivity output may be small because they are used for high acceleration. In this case, bonding is made so that an end of the supporting body 9 may be placed at a position indicated by c in the drawing.

In application for low acceleration such as an active suspension or an antilock brake of a vehicle, posture control of a robot, or virtual reality, an end of the supporting body 9 is placed at a position indicated by a in the drawing because sensitivity must be improved. Since a length L of the sensor portion becomes long, sensitivity is thereby increased.

Positions of diffused resistors are selected in accordance with applications for high acceleration and low acceleration. After selection, wires of any other diffused resistors are not necessary and thereby cut.

In this embodiment, since the portion at which displacement is observed does not have to be made thin as in the prior art, changes in fixing position of the supporting body 9 enables easy sensitivity adjustment in accordance with necessary application by providing the bridge circuit 50 in which a plurality of diffused resistors are incorporated.

Embodiment 2

Figure 14:
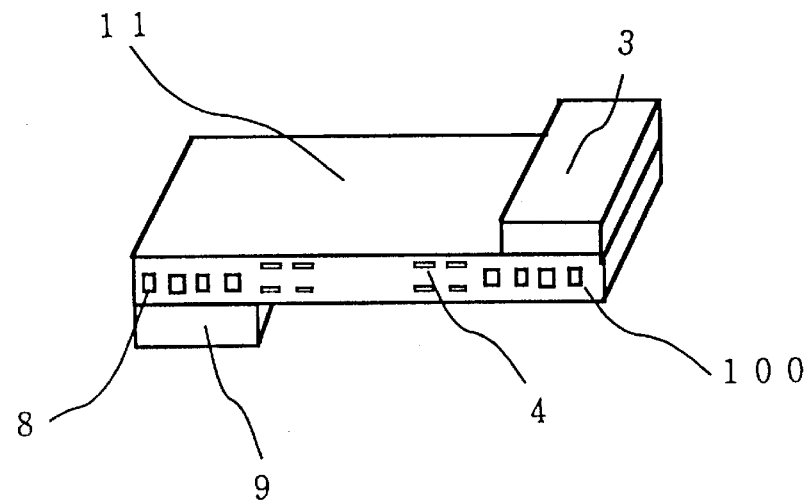
FIG. 14 is a perspective view showing the semiconductor acceleration sensor to which the bridge circuits are symmetrically provided in the horizontal direction according to the present invention.

FIG. 14 shows the configuration in which the strain sensing portions of the rectangular parallelopiped type structure taken out from the semiconductor substrate are positioned symmetrically.

Provision of the bridge circuits constituted by the diffused resistors 4 and the output terminals 8 with respect to the center of the side surface 100 of the semiconductor substrate 11 in the longitudinal direction contributes to improvement of the yield and simplification of the facility without mistaking left and right sides in the mounting process. Further, if one bridge circuit can operates even though failure of another bridge occurs, functions of the device can be achieved, thereby contributing to improvement of the yield.

In this embodiment, the mounting process can not be easily attained if the thin portion is formed by the conventional etching method. Even if mounting is successfully made, provision of the thin portion having the unnecessary diffused resistors may cause a problem of damage.

Since the structure is shaped into a rectangular parallelopiped in the present invention, handling can be readily attained and recognition of right and left sides is unnecessary, facilitating mass production of the device.

Application of the present invention to a pressure sensor can be an effective means. In case of the pressure sensor, a pressure reference chamber is produced as a structure to detect a difference in pressure using the pressure reference chamber. In this embodiment, the bridge circuits constituted by the diffused resistors 4 and the output terminals 8 are provided symmetrically with respect to the center of the side surface 100 of the semiconductor substrate 11 in the longitudinal direction. A displacement of the pressure is detected using the diffused resistors 4 by producing the pressure reference chamber on one side of the semiconductor substrate 11. The diffused resistors 4 may be arranged in the vicinity of the fixed end at which the stress becomes maximum.

Embodiment 3

Figure 15:
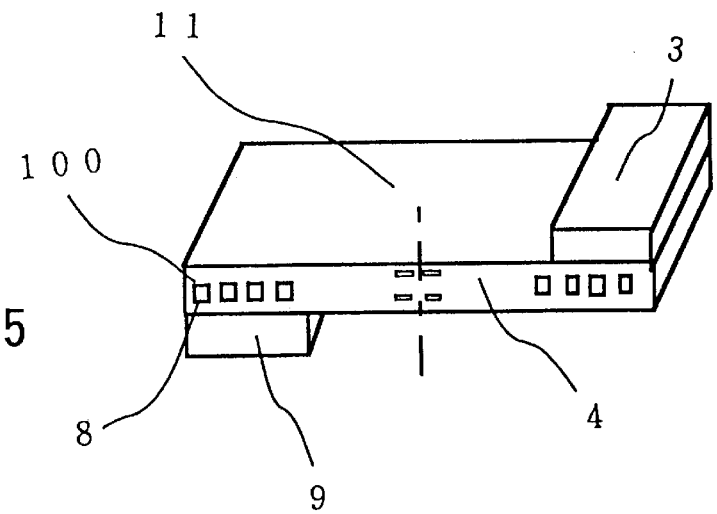
FIG. 15 is a perspective view of the semiconductor acceleration sensor to which output terminals are provided symmetrically in the horizontal direction with the bridge circuit in the center according to the present invention.

FIG. 15 shows a view in which the diffused resistors are arranged in the center of the semiconductor substrate 11. When the diffused resistors are arranged in the center, the right and left sides can not be mistaken in the mounting process to improve the yield and simplify the facility.

Embodiment 4

The following describes a circuit manufactured on the side surface 100. In regard of the circuit configuration on the side surface 100, the simplest configuration may be attained by the diffused resistors constituting the bridge circuits, the output terminals and wires. In addition, an amplification circuit or a filter circuit may be employed as another chip configuration. As to the filter circuit, the filter circuit can be configured by chip resistors.

The amplification circuit is included in this embodiment to effectively use the side surface 100 and reduce the noise.

Figure 16:
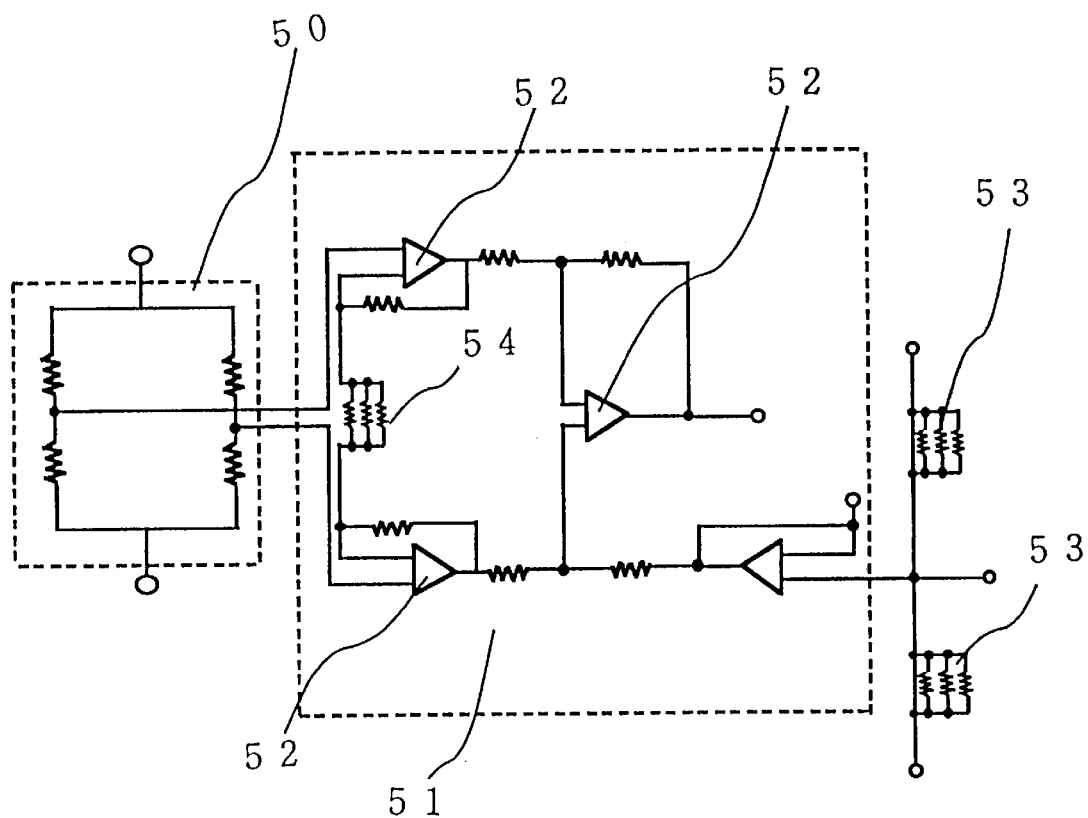
FIG. 16 is an electric circuit according to the present invention.

An electric circuit will now be described with reference to FIG. 16. A full-bridge circuit 50 is constituted as an electric circuit, and a resistance value of the piezoresistance gauge varies in accordance with a strain caused by the acceleration and detected as a change in voltage by the bridge circuit 50. Differential outputs from the sensor are converted into a single output by a differential amplification circuit 51 having three single-ended CMOS single power supply operation amplifiers 52. Note that the differential amplification circuit includes a sensitivity adjustment resistor 54 and offset adjustment trimming circuits 53 through the buffer. This embodiment is manufactured so that the fill length including the supporting portion is 9 mm and the width including the amplification circuit is 0.1 mm.

Two single-ended full-differential amplifiers or a chopper amplifier may be used to improve the S/N.

Figure 17:
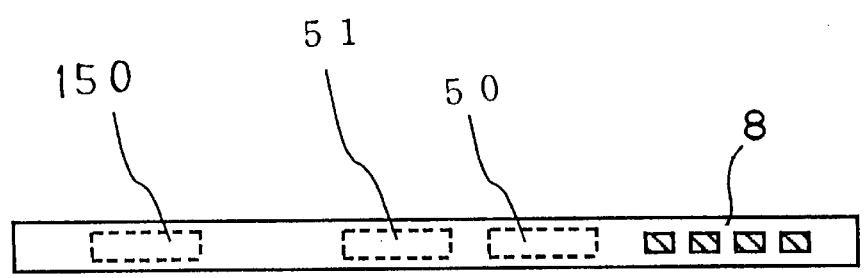
FIG. 17 is a plan view showing a layout of the electric circuit according to the present invention.

FIG. 17 is a plan view showing a layout of an electric circuit of the semiconductor acceleration sensor according to the present invention.

There are included an output terminal 8, a bridge circuit (piezoresistance) 50, a differential amplification circuit 51 and a bias circuit 150. In the layout of an area having a narrow width, the followings are noted as mentioned above. Vertically-aligned two MOS transistors are formed on the sensor portion of the sensor so that the W directions of source drains of the MOS transistors are symmetric with respect to the central line of the sensor in the L direction. By doing so, the electric circuit can be provided on a device having a small chip thickness (width). Further, in regard of wiring, aluminum wires electrically connecting between the MOS transistors constituting the electric circuit or the aluminum wires electrically connecting the MOS transistors and polysilicon forming the resistor portion are formed outside the MOS transistors and the polysilicon resistor portion. With this arrangement, wires are formed in the detailed portions.

Embodiment 5

Figure 5A:
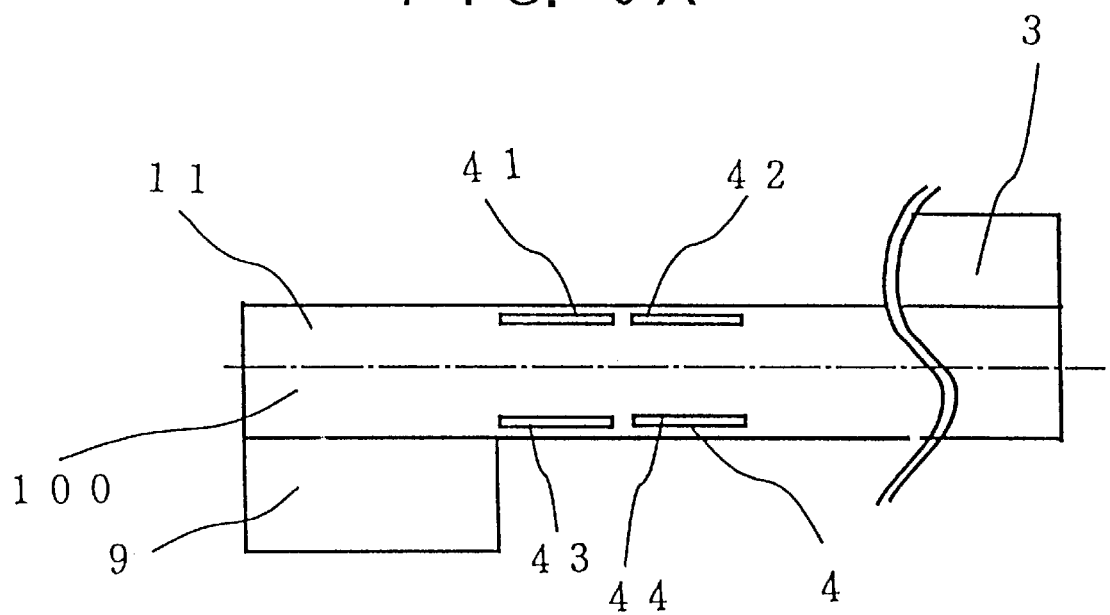
FIG. 5A is a front view showing the configuration of the semiconductor acceleration sensor according to the present invention.

The arrangement of the diffused resistors that is a characteristic of the present invention will now be described. FIG. 5A shows the arrangement of the diffused resistors 4 in this embodiment. Diffused resistors 41, 42, 43 and 44 may constitute a bridge circuit 50. Moreover, the diffused resistors may be separately arranged in such a manner that the diffused resistors 41 and 42 are provided in the vicinity of the top face of the semiconductor substrate 11 and the diffused resistors 43 and 44 are disposed in the vicinity of the bottom face of the same. Tensile stress and compressive stress may be detected using the diffused resistors 4 near the top face and the diffused resistors near the bottom face. It is preferable to provide the diffused resistors 41, 42, 43 and 44 so that their longitudinal direction becomes parallel with the longitudinal direction of the semiconductor substrate 11, i.e., the left-to-right direction in FIG. 5A.

Explaining the size and positional relationship of the device used in this embodiment with reference to the drawings, silicon having a length of 9 mm (L1=6 mm, L2=3 mm), a width W of 0.6 mm and a height Z of 0.1 mm is used as shown in FIGS. 2A and 2B. The width W is a thickness of the silicon substrate. Here, as shown in FIG. 5A, the diffused resistors 4 are made up of the diffused resistors 41 and 42 near the upper part of the side surface 100 of the semiconductor substrate 11 and the diffused resistors 43 and 44 near the lower part of the same, and each of the diffused resistor has a length of 0.3 mm and a width of 0.01 mm. The left edge of each of the diffused resistors 41 and 42 is placed at a right edge of the supporting body 9. In regard of the height direction of the semiconductor substrate, a distance between a surface of the semiconductor substrate 11 and the center of the diffused resistors 4 is 0.015 mm.

As apparent from this arrangement, the diffused resistors 4 are provided at the peripheral portion of the side surface 100 to improve sensitivity. Each wire is therefore disposed inside the diffused resistors 4 constituting the bridge circuit 50.

Figure 5B:
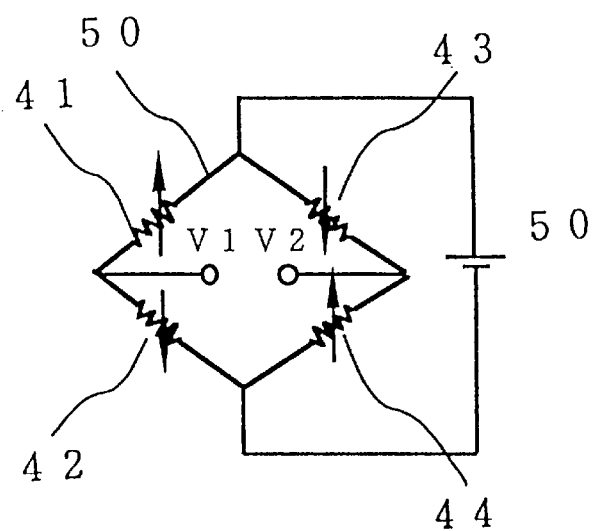
FIG. 5B shows a bridge circuit of the semiconductor acceleration sensor according to the present invention.

FIG. 5B shows the bridge circuit 50 having this configuration. The largest characteristic of the bridge circuit according to the present invention is that four diffused resistors are variable.

The following describes the reason why the arrangement of the diffused resistors in this embodiment can improve sensitivity.

Figure 3B:
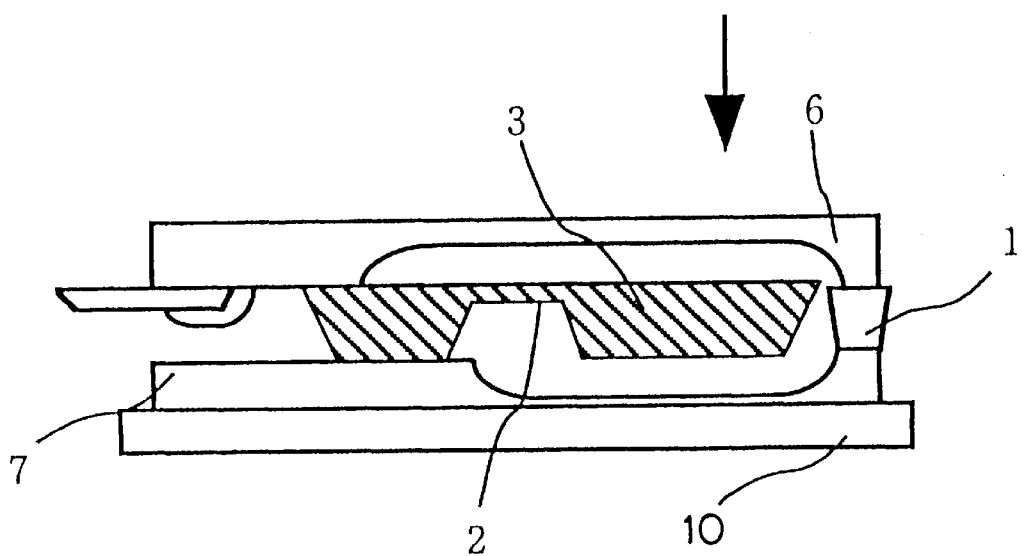
FIG. 3B is a cross-sectional view showing the structure of the prior art semiconductor acceleration senor.
Figure 4A:
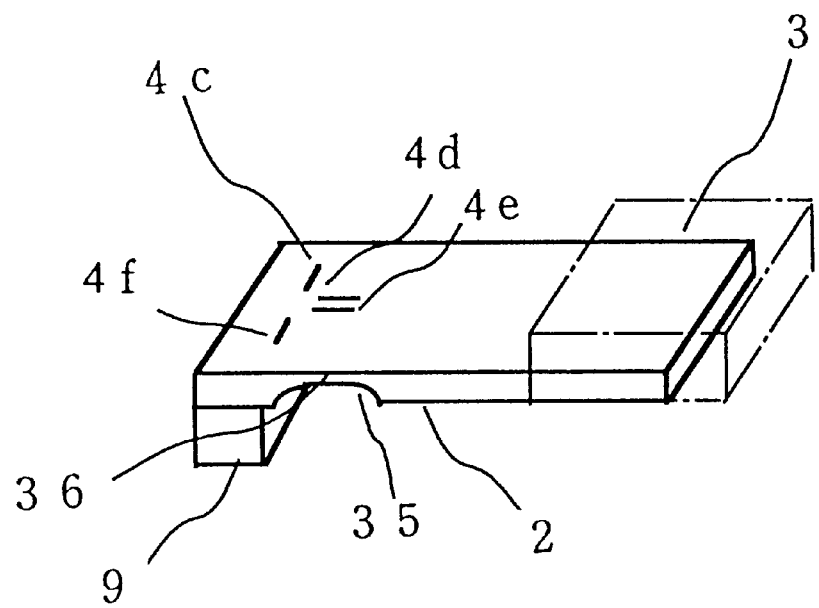
FIG. 4A is a perspective view showing the prior art semiconductor acceleration sensor.
Figure 4B:
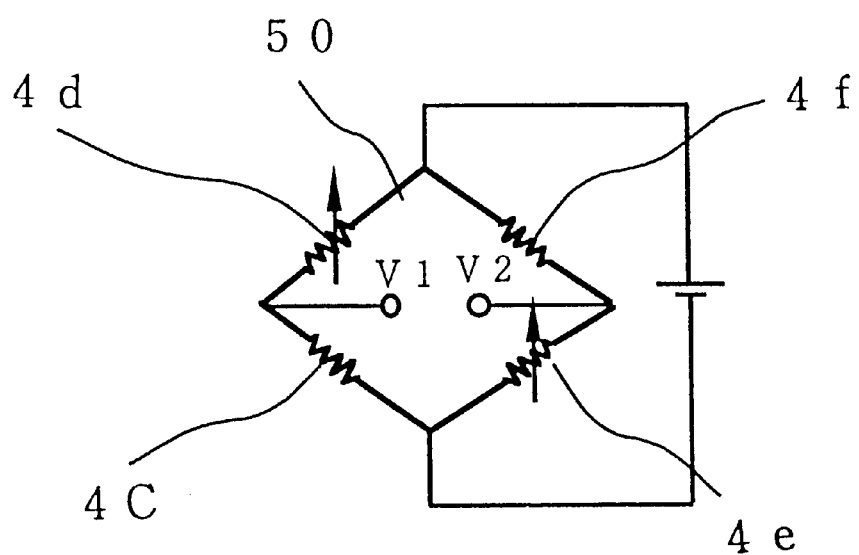
FIG. 4B shows a bridge circuit of the prior art semiconductor acceleration sensor.

When providing the diffused resistors 4 on the conventional plane shown in FIG. 3B, 4c and 4f are used as reference resistors while 4d and 4e are used as measurement resistors to form the bridge circuit 50. If 4c and 4f are represented as R, 4d and 4e are represented by R+ΔR. Here, assuming that an output is VOUT, the following expressions are obtained:

$$V1=(R/2R+\Delta R)V \quad (1)$$

$$V2=(R+\Delta R/2R+\Delta R)V \quad (2)$$

$$VOUT=V2-V1=(R/2R+\Delta R)V \quad (3)$$

Further, in the electric circuit according to the present invention, assuming that the resistance value obtained by compressive stress is represented as R+ΔR and the resistance value obtained by tensile stress is represented as R−ΔR, the following expressions can be obtained:

$$V1=(R-\Delta R/2R)V \quad (4)$$

$$V2=(R+\Delta R/2R)V \quad (5)$$

$$VOUT=V2-V1=(R/R)V \quad (6)$$

If R is assumed to be an extremely small value from the expressions (3) and (6) and ignored, the electric circuit according to the invention is twice as powerful as the prior art circuit. Therefore, in the arrangement of the diffused resistors 4 according to the present invention, the diffused resistors 4 are so disposed as to improve sensitivity by utilizing the tensile stress and compressive stress.

Figure 7A:
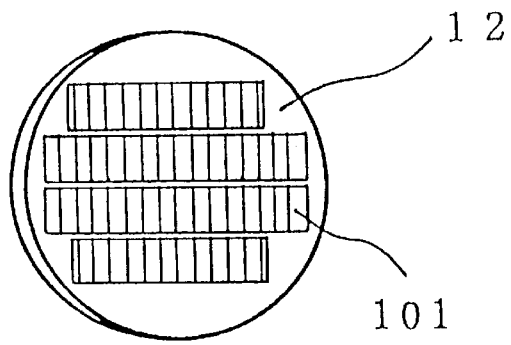
FIGS. 7A–7C are views showing the process for manufacturing the semiconductor acceleration sensor according to the present invention.

The method for manufacturing the semiconductor acceleration sensor according to the present invention will now be described with reference to the process drawings of FIGS. 7. As the method for manufacturing the semiconductor acceleration sensor, the diffused resistors 4 and the output terminals 8 are patterned on the surface of the semiconductor wafer 12 in FIG. 7A; and the semiconductor wafer 12 is cut so that the diffused resistors 4 and the output terminals 8 are provided on the same plane to obtained the semiconductor substrate 11 in FIG. 7B. The semiconductor substrate 11 is joined with the supporting body 9 and the dead-weight 3 in FIG. 7C. Here, on the surface of the semiconductor wafer 12 may be patterned an amplification circuit, a filter circuit and a temperature compensation circuit, as well as the diffused resistors 4 or the output terminals 8. Moreover, dicing may be enabled for cutting the semiconductor wafer 12. Dicing is carried out in such a manner that a line for scribing is provided to the outer portion of the semiconductor substrate 11 and the semiconductor wafer is cut by dicing with the line for scribing as a reference. The acceleration sensor semiconductor devices 101 are arranged in the semiconductor wafer 12.

In this embodiment, the low acceleration device is produced. The low acceleration corresponds to 1 to 2G (G=9.8 m/s2). It is assumed that the length of the entire device is 9 mm (L1=6 mm, L2=3 mm), the width W is 0.6 mm and the height Z is 0.1 mm. Note that the acceleration sensor for low acceleration is applied for detecting earthquake or virtual reality. Further, it functions as a shock sensor for detecting the drop impact.

Embodiment 6

Figure 7B:
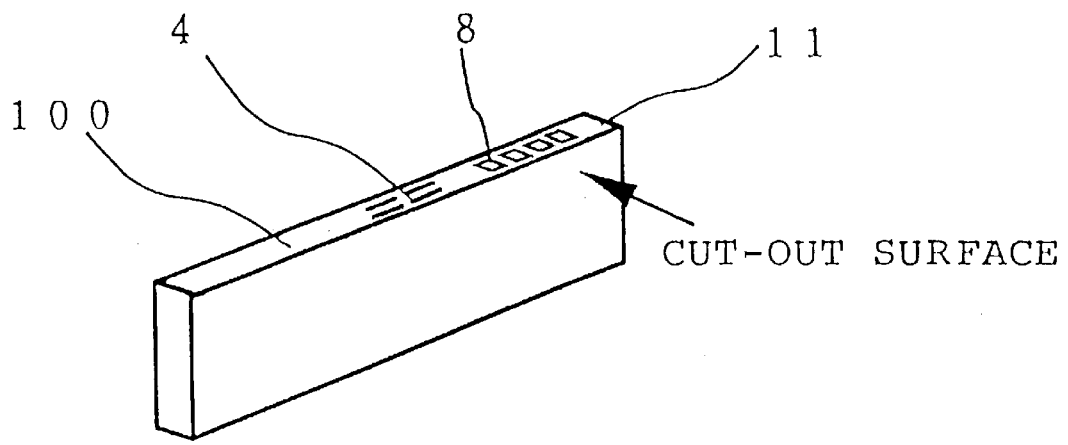

The device shown in FIG. 7B is cut out.

Thereafter, individual devices are obtained by being cut out from the semiconductor wafer 12 by dicing. The state shown in FIG. 7B is obtained. FIG. 7B shows the cut-out surface.

Although the semiconductor substrate 11 can be cut out in the dicing method using water as regular cutting liquid, the semiconductor substrate 11 is cut out in the following manner to improve accuracy in this embodiment.

Figure 8:
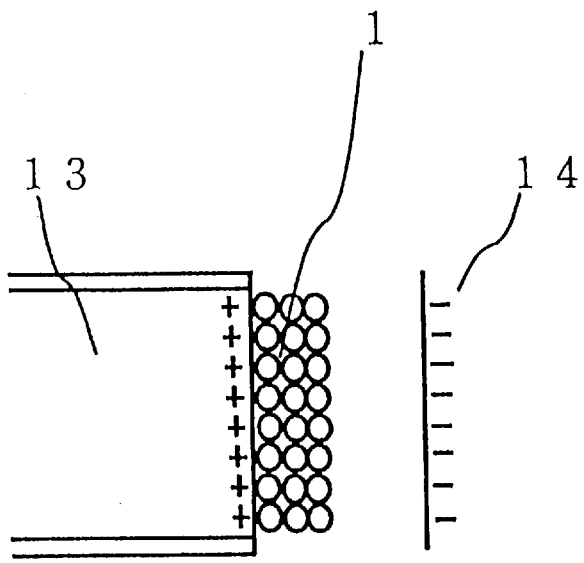
FIG. 8 is an explanatory view showing the electrophoresis phenomenon according to one embodiment of the present invention.

When the device is cut out in the process for cutting the semiconductor wafer 12, pitching is generated in the device as the cutting resistance to the device is increased, which leads to such a problem as that the diffused resistors 4 are damaged or the device can not be machined with a predetermined dimension. In order to eliminates such a problem, the electrophoresis phenomenon of the superfine abrasive grain is utilized. The following describes its principle. The superfine silica abrasive grain is used in the cutting liquid. The superfine silica abrasive grain is charged attracted to negative in the alkali liquid. If the electric field has an effect, the silica therefore migrates toward an anode 13. It does migrate toward a cathode 14. This phenomenon is shown in FIG. 8. The superfine silica abrasive grains are provided at the charged electrode of the anode 13. The silica particles 15 of colloidal silica electrically causes absorption phenomenon on the surface of the electrode. When the electric field has an effect, the absorption layer is continuously formed on the surface of the electrode. In other words, the absorption layers of the superfine silica abrasive grains can be readily formed by producing the electric field to a blade 16, thus enabling machining with the cutting resistance reduced.

Figure 9:
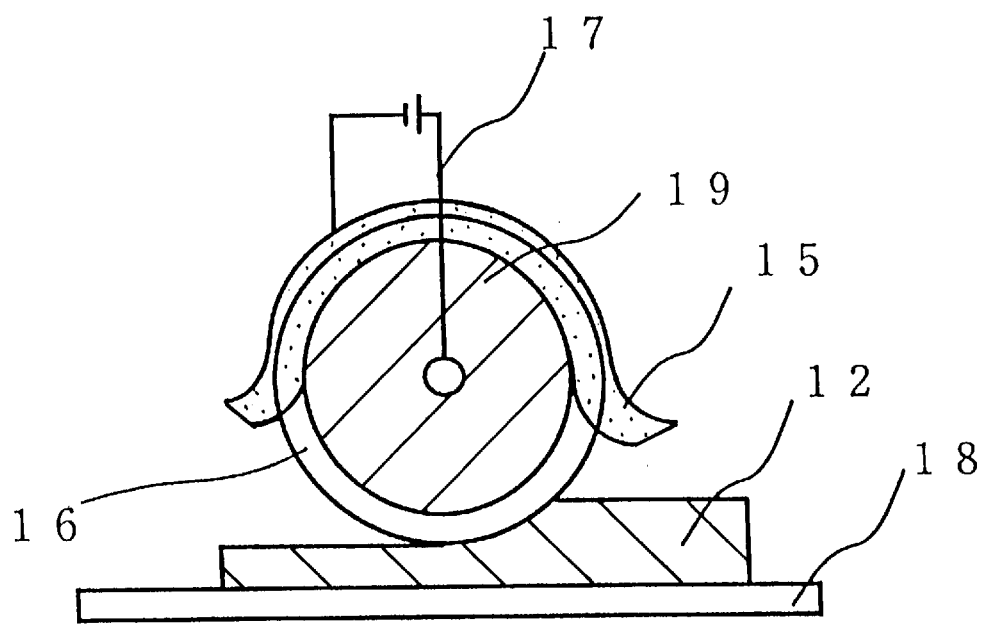
FIG. 9 is an explanatory view of a dicing apparatus according to one embodiment of the present invention.

The structure of the device used in this embodiment is shown in FIG. 9. The device is constituted by providing a mechanism for supplying abrasive material to a dicing blade 16 and a power supply 17 for subjecting the dicing blade 16 to electrolysis on the dicing apparatus which is normally used. The blade is fixed by a flange 19. Colloidal silica that is cutting material is supplied to the blade 16 and the blade 16 is subjected to electrolysis by the direct current power supply 17 to form a silica layer on the blade 16. With this configuration, the semiconductor wafer 12 is installed on a chuck 18 and cut by the dicing apparatus.

Figure 10:
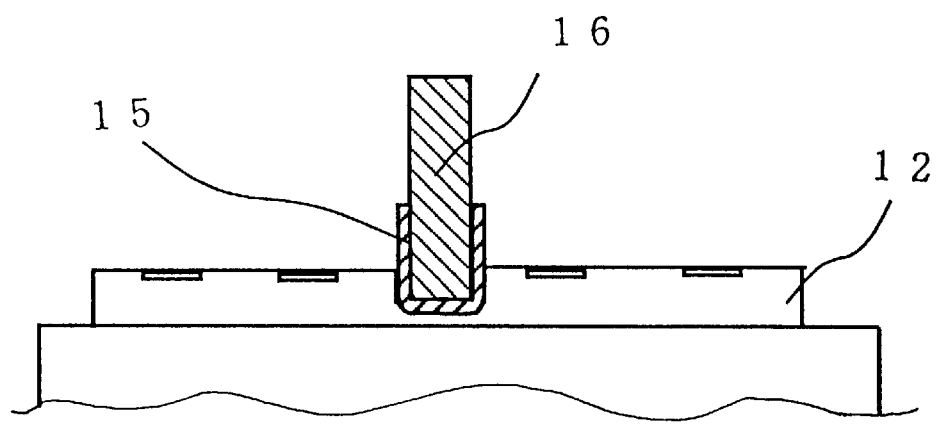
FIG. 10 is an explanatory view of a dicing method according to one embodiment of the present invention.

The following describes the machining using this embodiment with reference to FIG. 10. The dicing blade 16 moves down on the fixed semiconductor wafer 12 to be brought into contact with the semiconductor wafer 12. At this stage, superfine silica abrasive grains are supplied to the blade as abrasive material. The silica particles 15 are adhered to the blade 16. The superfine silica abrasive grain has a particle size of 10 nm to 20 nm, and silica having this particle size is charged on the anode 13 and adhered to the dicing blade 16. This adhesive layer cuts the semiconductor wafer 12 that is a work to demonstrate an effect, which leads to excellent machining.

When the device is cut out in accordance with the above dimensions in the present embodiment, a quantity of chipping of 10 microns is obtained in the prior art dicing, but it is improved to 2 microns in this embodiment. As a result, the stable device with the good yield can be supplied without cutting the wires or damaging the diffused layer.

Embodiment 7

Figure 11:
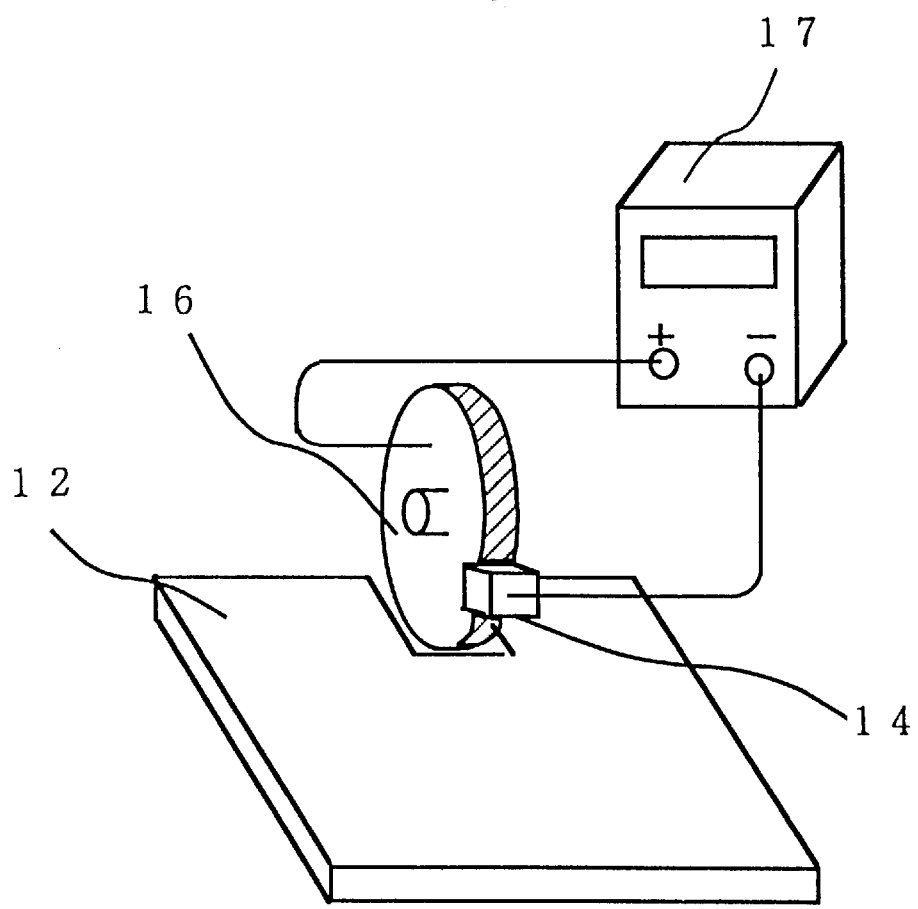
FIG. 11 is an explanatory view of the dicing method according to one embodiment of the present invention.
Figure 12:
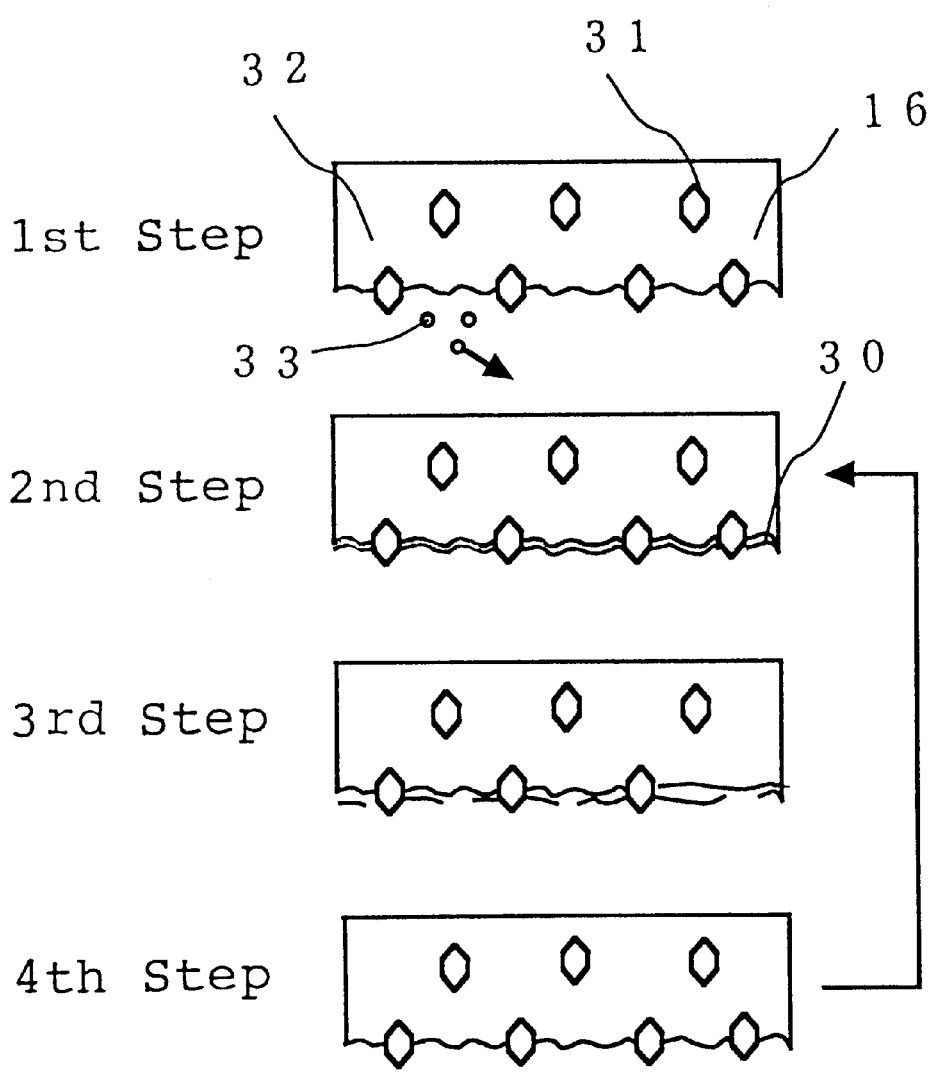
FIG. 12 is an explanatory view used for explaining the electrolytic in-process according to one embodiment of the present invention.

As a method for reducing a quantity of chipping, cast iron is used as bonding material 32 and the dicing blade 16 having diamond particles 31 is used to subject the dicing blade 16 to electrolysis. A non-conductive coat 30 is formed on a surface of the abrasive wheel with electrolysis of the bonding material, and elusion is stopped to obtain a predetermined projection of abrasive particles. The process will be described with reference to FIG. 12. At the first step, the blade 16 is subjected to electrolysis. Cast iron of the bonding material of the blade 16 eludes. It eludes as iron ion 33. After elusion, oxidation is started and the non-conductive coat 30 is formed on a surface of the blade 16 (second step). The diamond particles 31 protrude from the blade 16. In this state, cutting is started. As cutting continues, the diamond particles 31 are peeled off or the non-conductive coat 30 is gradually removed. The cutting environment is therefore deteriorated. At this stage, the bonding material 32 again eludes by electrolysis (third step). The non-conductive coat 30 is then formed (return to the second step). The second, third and fourth steps are repeated to advance cutting. This system is called electrolysis in-process. The configuration of the apparatus based on this system will be explained with reference to FIG. 11. The apparatus is composed of the structure for subjecting the dicing blade 16 to electrolysis, a cathode attachment 14 provided in the vicinity of the dicing blade 16 and the structure for subjecting the blade 16 to electrolysis using the direct current power supply 17. With this configuration, the semiconductor wafer 12 is cut.

In this embodiment a dicing tape for fixation which weakens adhesive power by irradiation of ultraviolet rays is used as a means for fixing the semiconductor wafer 12 that is a work, which facilitates detachment and realizes assured fixation.

According to the above-described method, the device can be taken out with reduced chipping and layers deformed during machining by cutting in the dicing apparatus.

Although various devices are applied to cutting in the present embodiment, the similar characteristics can be obtained by polishing the semiconductor substrate 11. For example, layers deformed during machining can be advantageously eliminated by the superfine polishing method such as float polishing. According to double-side polishing, the side surface 100 can be uniformly polished from the both sides thereof, equalizing distances to the diffused resistors.

Embodiment 8

Figure 7C:
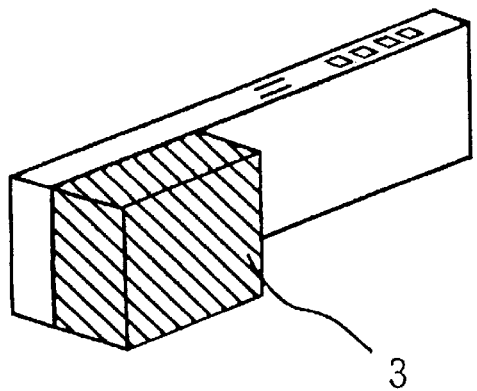

In the manufacturing method, a dead-weight 3 is provided to one end of the semiconductor substrate 11 in order to improve detection sensitivity of the acceleration sensor, as shown in FIG. 7C. As the dead-weight 3, metal or silicon can be used. The dead-weight 3 and the supporting body 9 are fixed to the semiconductor substrate 11. The supporting body 9 may be previously fixed to a supporting board 11. Here, since a position at which the dead-weight is fixed, i.e., a position of the center of gravity is important, adhesive is applied to the central position of the dead-weight 3 in advance so that the center of the dead-weight 3 can be set at the position of the center of gravity. Since the adhesive is applied to the center of the dead-weight 3, this process is carried out according to the self-alignment method by which the central position of the dead-weight 3 can be easily obtained. Further, the adhesive or any material which can be easily matched with the adhesive may be applied or a film of such material may be formed at a part of the semiconductor board 11 on which the dead-weight 3 is mounted.

Embodiment 9

The dead-weight is an important element for obtaining sensitivity. If the sensor itself receives the gravity by the average partial load, the resistance values of the diffused resistor rarely show chances, thus obtaining no output. The dead-weight is therefore required. In addition, it is important to mount the dead-weight at the center of gravity of the sensor. As described above, although the adhesive can be used for guiding, a groove may be previously formed to the dead-weight itself so that the groove of the dead-weight is used for guiding the center of gravity.

The shape may be a cube or a circular cylinder. If a circular cylinder is selected, there occurs no problem during rotation when fixation is carried out. That is very convenient.

According to the present invention, it is effective to fix the dead-weight 3 along the side face 100 because the diffused resistors 4 are provided on the side surface 100.

Embodiment 10

Figure 18:
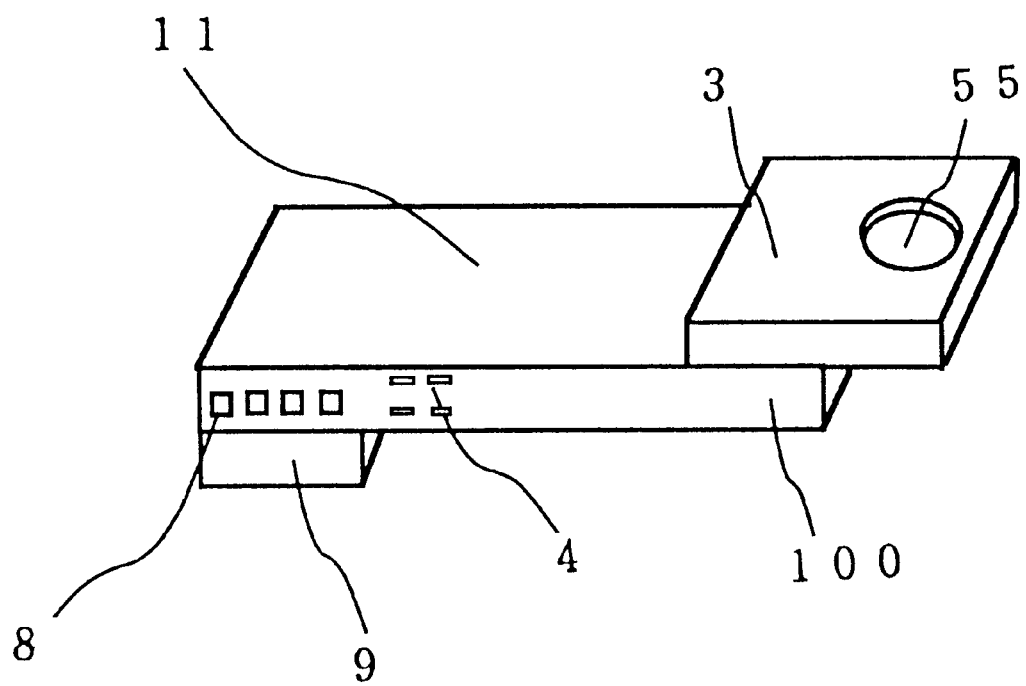
FIG. 18 is a perspective view of the semiconductor acceleration sensor having through holes in a dead-weight according to the present invention.

Further, the dead-weight 3 may have a through hole 55. The damping effect is changed by the through hole 55 and the frequency characteristic as the acceleration sensor also varies. This is a good means for obtaining a desired cut-off frequency. FIG. 18 shows the acceleration sensor having a through hole 55 in the dead-weight 3. Besides adjustment of the frequency characteristic, the through hole 55 is effected from the following reasons. When silicon oil 48 for improving impact resistance is put in the package, the generated air bank is attached to the acceleration sensor. When the air bank is attached to the dead-weight 3, it greatly affects on the output sensitivity. If the through hole 55 is provided to the dead-weight 3, such attachment can be avoided. In addition, if the rear surface of the dead-weight 3 is tapered, the air bank can be easily detached along the tapered shape, and this shape is thus effective.

Although an example of only one through hole 55 is mentioned in this embodiment, a plurality of through holes may be provided.

Embodiment 11

Figure 19A:
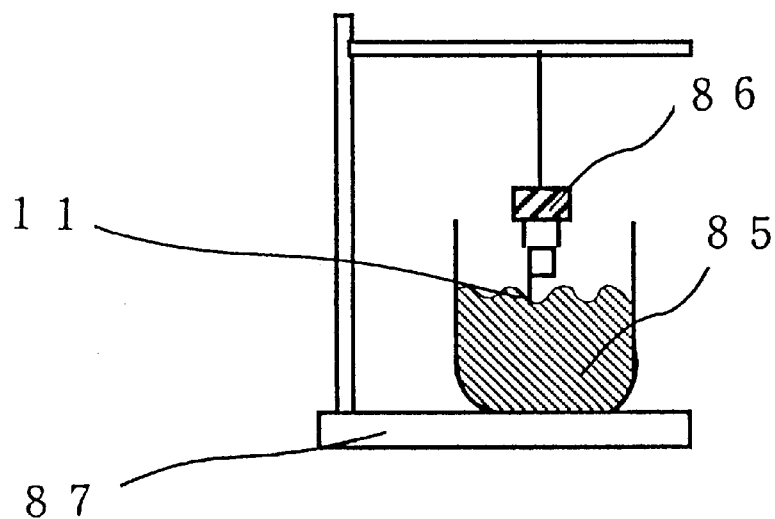
FIGS. 19A–19C are explanatory views used for explaining a method for adding a deadweight according to the present invention.
Figure 19B:
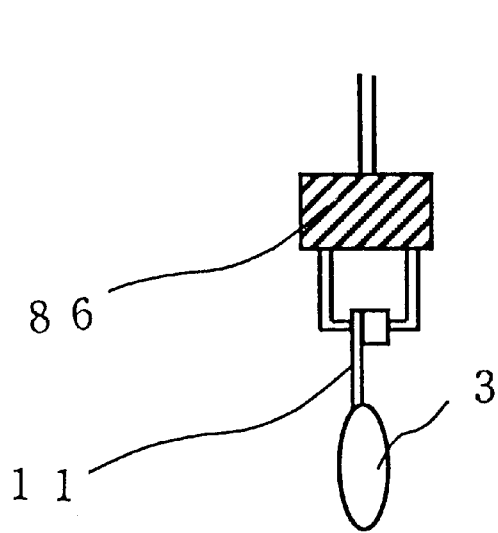

The dead-weight 3 was provided to the tip of the semiconductor substrate 11 in such a manner that the semiconductor substrate 11 is dipped in and lifted up from melt using a chuck 86 in a dead-weight manufacturing apparatus 67. FIG. 19A shows the structure of this apparatus. According to this method, the dead-weights 3 having a uniform weight can be easily provided. FIG. 19B is an enlarged view showing the apparatus. The semiconductor substrate 11 having the supporting body 9 is handled using a chuck 86.

Figure 19C:
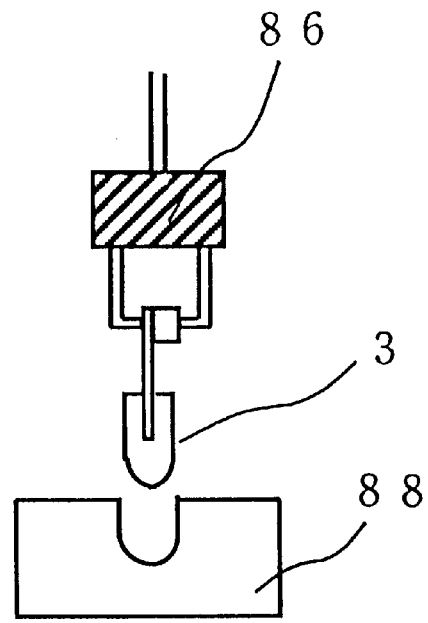

In FIG. 19C, the dead-weight was formed into any desired shape by using a container for forming the shape of the dead-weight 3. Melt was put in the container, and the semiconductor substrate 11 was inserted into a dead-weight mold 88 by the chuck 86 and lifted up after coagulation, thereby forming the dead-weight having a desired shape. Here, the melt may be metal or polymeric substance. Note that use of material which matches with the material of the dead-weight 3 for the semiconductor substrate 11 involves formation of the dead-weight 3 having a desired shape at any desired position.

Embodiment 12

Figure 20:
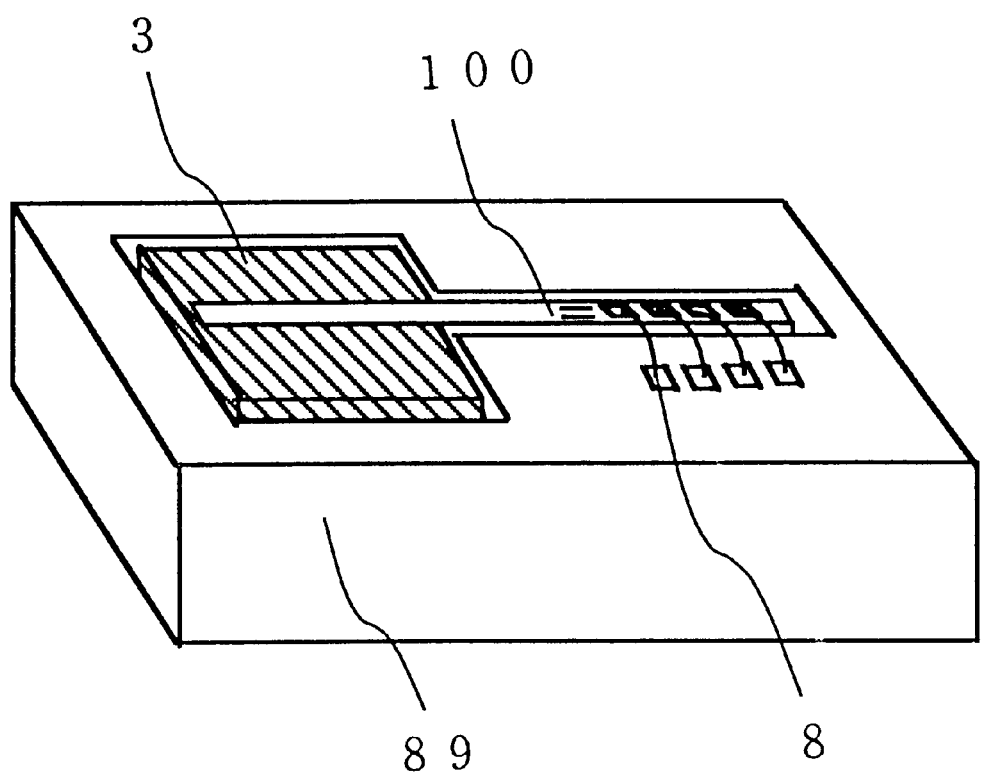
FIG. 20 is an explanatory view used for explaining one embodiment of a method for adding a dead-weight according to the present invention.
Figure 21A:
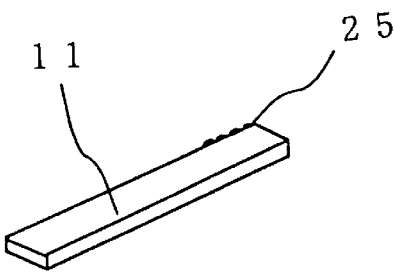
FIGS. 21A–21D are views explanatory used for explaining a mounting method according to The present invention.
Figure 21B:
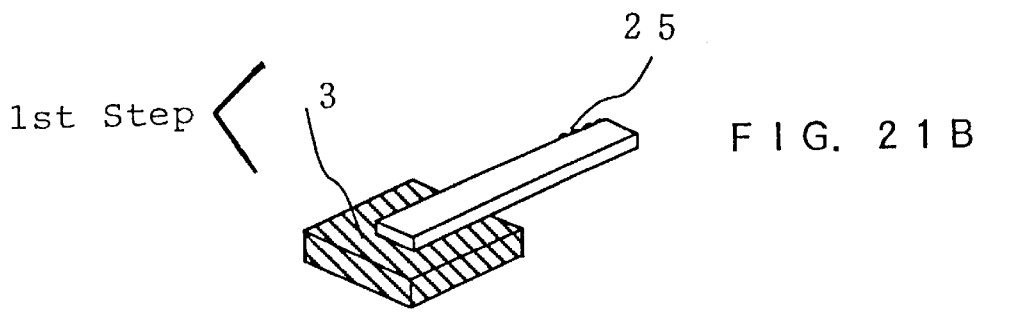
Figure 21C:
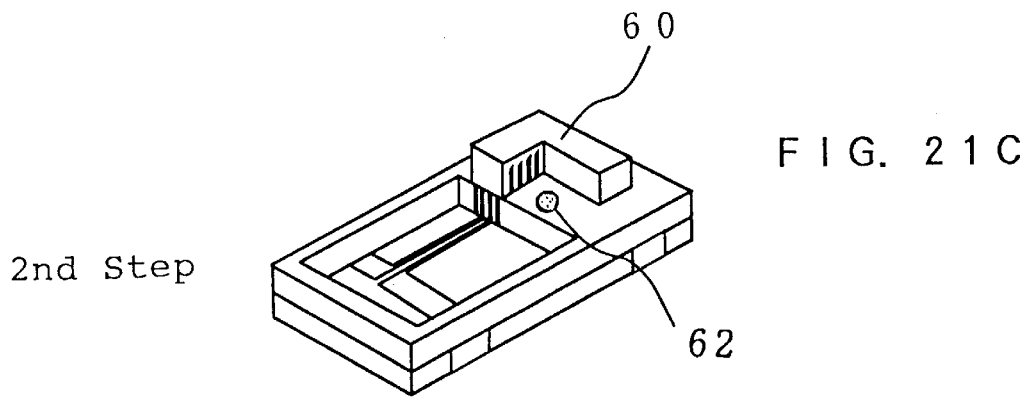
Figure 21D:
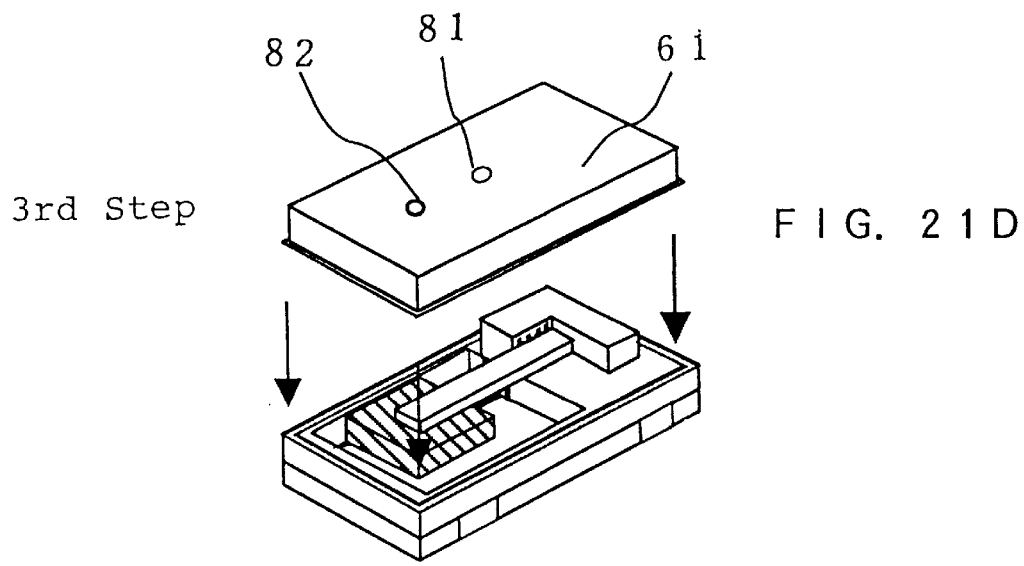

According to this method, coagulation and contraction of the dead-weight was utilized for preventing damage. The following describes the detail thereof with reference to FIG. 20. A package case 89 such as shown in FIG. 20 is used to dip a part which is to be the dead-weight 3 into the above-mentioned melt 85 shown in FIG. 19. The melt is contracted by being coagulated, and a gap is produced between the melt 85 and the package case 89. This gap can be displaced when the semiconductor substrate receives the acceleration and suppress the excessive displacement using the package case 89 when the excessive acceleration is applied, thereby preventing damage.

Embodiment 13

As described above, a metal structure or silicon is mounted as he dead-weight, but the output sensitivity slightly varies depending on the dead-weight accuracy or the position at which the dead-weight is provided. If control is performed using the output value when disposing the dead-weight, an adjustment function is not required. As the method for manufacturing the device while adjusting the dead-weight, it is effective to manufacture the device for the high acceleration by using a thin film process such as evaporation, but the sensitivity is needed to that for the low acceleration thus requiring the dead-weight of a few mg to several tens mg. The dead-weight is provided over several times for adjustment because the output sensitivity can be adjusted by the position at which the dead-weight is provided and the weight of the dead-weight. When providing the dead-weight, outputs from the sensor are monitored. Further, when a tip of the semiconductor substrate 11 is dipped into the above-mentioned melt and the dead-weight is disposed by coagulation of the melt, the sensitivity may be adjusted by repeatedly dipping into the melt because the dead-weight is attached utilizing the surface tension. This method is facilitated because the present invention has a rectangular parallelopiped structure, but it can not be used in the prior art in which a part that displays displacement is partially made thin because it leads to damage. In case of the micro machining, this method is difficult to be employed because of integral machining.

Embodiment 14

The following describes the package for taking out electric outputs from the terminals of the semiconductor substrate 11 to the supporting board 10.

In this embodiment, an L-shaped wiring board that is orthogonal to the supporting board 10 is provided to the board 10 for supporting the semiconductor substrate 11. FIGS. 21A–21D show the mounting process using the board 10 having the L-shaped wiring board. The second step of FIG. 21 shows the board 10 having the L-shaped wiring board 60. The board is formed into the L-shape because the semiconductor substrate 11 can be accurately positioned. That is, the semiconductor substrate 11 is fixed via the adhesive 62 with the L-shaped wiring board 50 as a guide.

The L-shaped wiring board 60 has wires on a surface orthogonal to the surface of the board 10. Gold bumps 25 of the semiconductor substrate 11 are connected with the wires to attain electrical connection between the semiconductor substrate 11 and the board 10. Bumps may be produced by solder.

The gold bumps 25 are first formed at output terminals and the dead-weight is fixed at the first step. When fixing the dead-weight 3, the adhesive, 62 having the similar coefficient of thermal expansion may be used.

At the second step, the supporting board 10 is manufactured. Ceramics is used for the supporting board 10 in this embodiment. The ceramics is optimum in applications in which high reliability is desired because its transferability of the high frequency is excellent. Note that a glass epoxy board may be also used in such applications.

The supporting board 10 has the L-shaped wiring board 60 as mentioned above. Gold is used for wiring material.

At the third step, silver paste is used as the adhesive 62 to be applied to the gold bumps 25 of the semiconductor substrate 11, and the semiconductor substrate 11 is mounted on a supporting portion of the supporting board 10 to be heated and adhered. Adherence is completed in a few seconds.

A cover is mounted on the supporting board 10 and thermally adhered using soldering, and silicon oil 48 is injected to improve impact resistance. Oil is injected by applying pressure. Sealing is attained using the adhesive. With the process described so far, the function as the sensor can be obtained. Although the silicon oil 48 is injected by applying the pressure, the package may be evacuated to inject the oil therein.

With the process described so far, the function as the sensor can be achieved.

Embodiment 15

Fixation of the semiconductor substrate is important because it affects on the sensitivity characteristic of other axes.

Figure 6A:
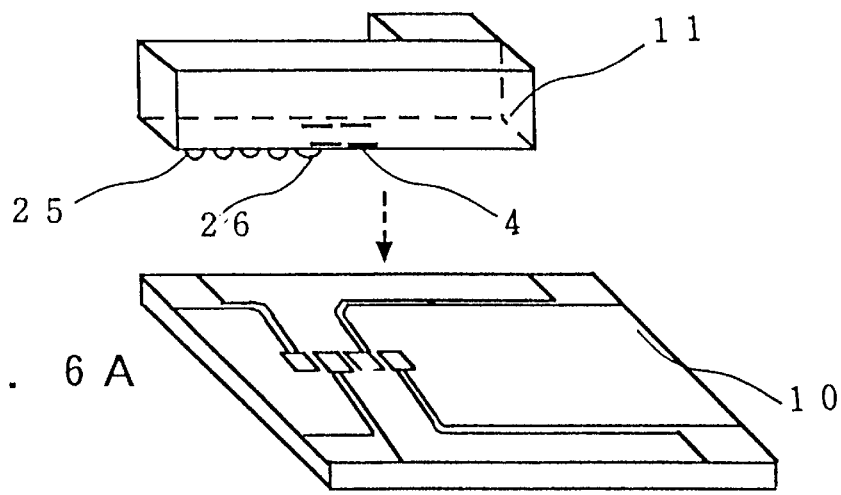
FIGS. 6A–6C are explanatory views used for explaining a fixing method according to the present invention.

A method for fixing the substrate to another supporting body will now be described with reference to FIG. 6. FIG. 6A shows the case where the semiconductor substrate 11 is directly fixed to the supporting board 10 to simultaneously assure conductivity. Bumps 25 are formed to the output terminals 8 of the semiconductor substrate 11. The bumps 25 are opposed to the supporting board so that the bumps 25 of the semiconductor substrate 11 are brought into contact with the terminals of the supporting board 10. The bumps 25 are melted by reflow process to be fixed to the supporting board 10. It is preferable to manufacture bumps for fixation in the vicinity of the diffused resistors 4 and fixed to the supporting board 10 in order to obtain the improved sensitivity. Values that satisfy the characteristics can be obtained according to this method. The bumps 25 come into contact with the supporting board 10 and melted to be fixed as shown in the drawing. It is necessary to attain assured fixation in the vicinity of the diffused resistors, the bump 26 for fixation was used for a purpose other than obtaining conductivity.

Embodiment 16

Figure 6B:
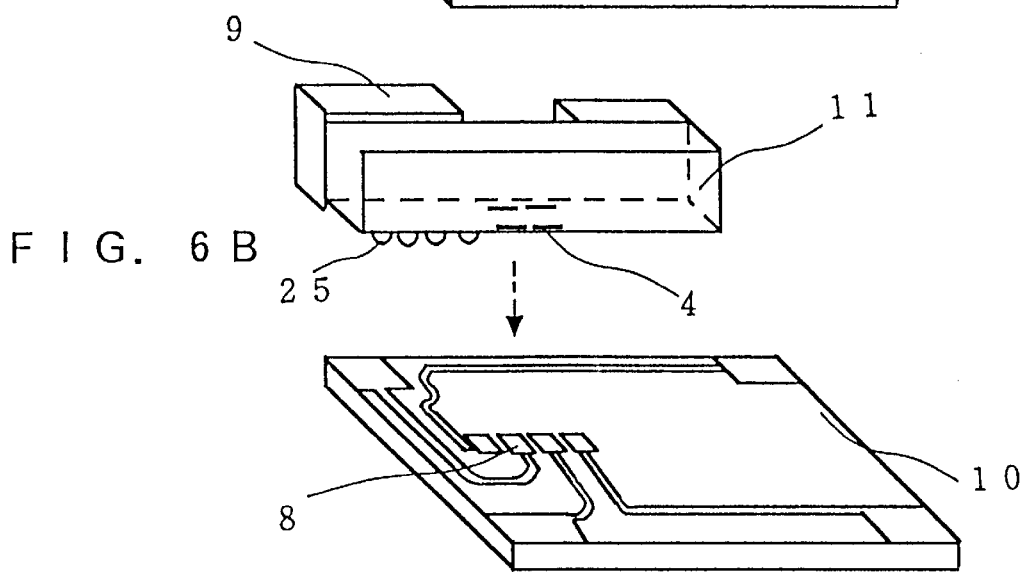

In FIG. 6B, the supporting body 9 was previously fixed and the supporting body 9 and the supporting board 10 were fixed to obtain conductivity using the bumps of the semiconductor substrate 11. Here, the silver paste is transferred to the bumps 25 of the semiconductor substrate 11 in advance. The silver paste attached to the bumps 25 of the semiconductor substrate 11 and the terminals of the supporting board 10 are connected with each other to obtain conductivity.

Embodiment 17

Figure 6C:
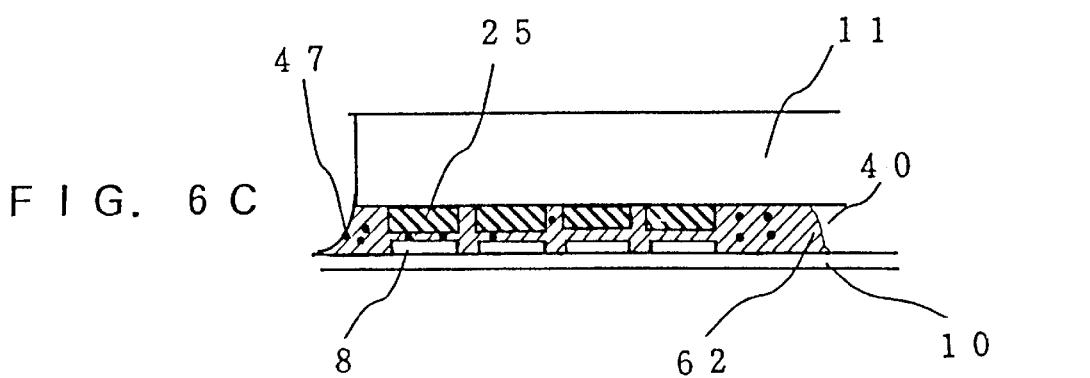

FIG. 6C shows the bonding method using an anisotropic conductive film 40. The anisotropic conductive film 40 has small conductive particles 47 dispersed in the adhesive 62. As shown in FIG. 6C, particles are sandwiched between electrodes by thermocompression bonding to attain electrical conductivity, insulation between adjacent electrodes is maintained, and mechanical bonding is achieved by curing of the adhesive 62. Conductivity is established between the bumps 25 and the output terminals 8 through the conductive particles according to this system.

With this configuration in which the bonding portion becomes thick according to this system, a gap is provided between the supporting board 10 and the semiconductor substrate 11, and it is hence unnecessary to provide a shoulder portion at which the semiconductor substrate 11 oscillates in response to application of the acceleration to the supporting board in advance. Further, in FIGS. 6A and 6B, a clearance is made between the semiconductor substrate 11 and the supporting board 10.

The cost of the supporting board 10 can be thus reduced.

The semiconductor substrate 11 may be fixed to the supporting board 9 by anode bonding. In this case, glass is used for the supporting board.

Although the supporting board is provided to only one side in this embodiment, it may be disposed to the both sides. This is effective for secure fixation.

An output of 5 mV was obtained as a voltage by providing the dead-weight 3 of 30 mg in the semiconductor acceleration sensor in this embodiment. With this value as an output voltage that is not amplified, the excellent characteristic was obtained. Further, the multiaxis sensitivity was 2% of the full-scale value. This good multiaxis sensitivity is due to the configuration of the semiconductor substrate 11. The length of the sensor portion is 6 mm and the width thereof is 0.6 mm that is a thickness of the semiconductor wafer 12. It was determined that the thickness of the sensor portion is a feed pitch distance of the dicing apparatus, i.e., 0.1 mm. The pitch distance of 0.1 mm is a value obtained by taking into account the yield such as outgoing of the device caused by dicing. Here, the thickness of the semiconductor substrate 11 is 0.1 mm that is approximately ⅙ of the width of the semiconductor substrate 11, i.e., 0.6 mm. With this configuration, the device which has no sensitivity with respect to multiple axes was realized.

In arrangement of the diffused resistors 4 according to this embodiment, the multiaxis sensitivity is hardly affected because a difference in displacement relative to the four diffused resistors is small.

In the above-described structure, the diffused resistors 4 are disposed on only one side surface, but the diffused resistors 4 may be provided on the both side surfaces.

Embodiment 18

The semiconductor substrate 11 having the diffused resistors is fixed to the supporting body 9 and then covered with the package. Here, since the semiconductor substrate 11 is very thin, it must be prevented from being damaged. Although the acceleration sensor according to the present invention is shaped into a rectangular parallelopiped and is impact resistant as compared with the prior art acceleration sensor, the protection measure was taken for improving reliability.

The above has described the means for lowering the resonance frequency to avoid damage by using the silicon oil 48, and another means will now be explained.

There is a method such that gel type substance 70 is injected to the joint portion at which the semiconductor substrate 11 is fixed to the supporting body 9.

The gel type substance 70 is a material superior in vibrationproofing and impact insulating effects. In addition, it is a material superior in adiabatic effect.

FIG. 22 shows the joint portion at which the semiconductor substrate 11 is connected with the supporting body 9 via the gel 70. The gel 70 demonstrates the effect in prevention of damage at the resonance point or improvement of the frequency characteristic because it eliminates the high frequency component. In this case, a gap at the engagement portion is preferably a few $\mu$m. If the gap becomes large, the sensitivity is lowered or the frequency characteristic is deteriorated.

When the gel 70 is injected to the space of a few $\mu$m at the engagement portion of the supporting body, application of the high frequency oscillation to the acceleration sensor device removes the high frequency component, thereby obtaining a good frequency characteristic. Further, the high frequency is not captured and the impact resistant structure can be hence obtained. This system is convenient and advantageous.

Furthermore, the silicon gel may be injected into the engagement portion, or oil or gel may be sealed in the package.

Figure 24:
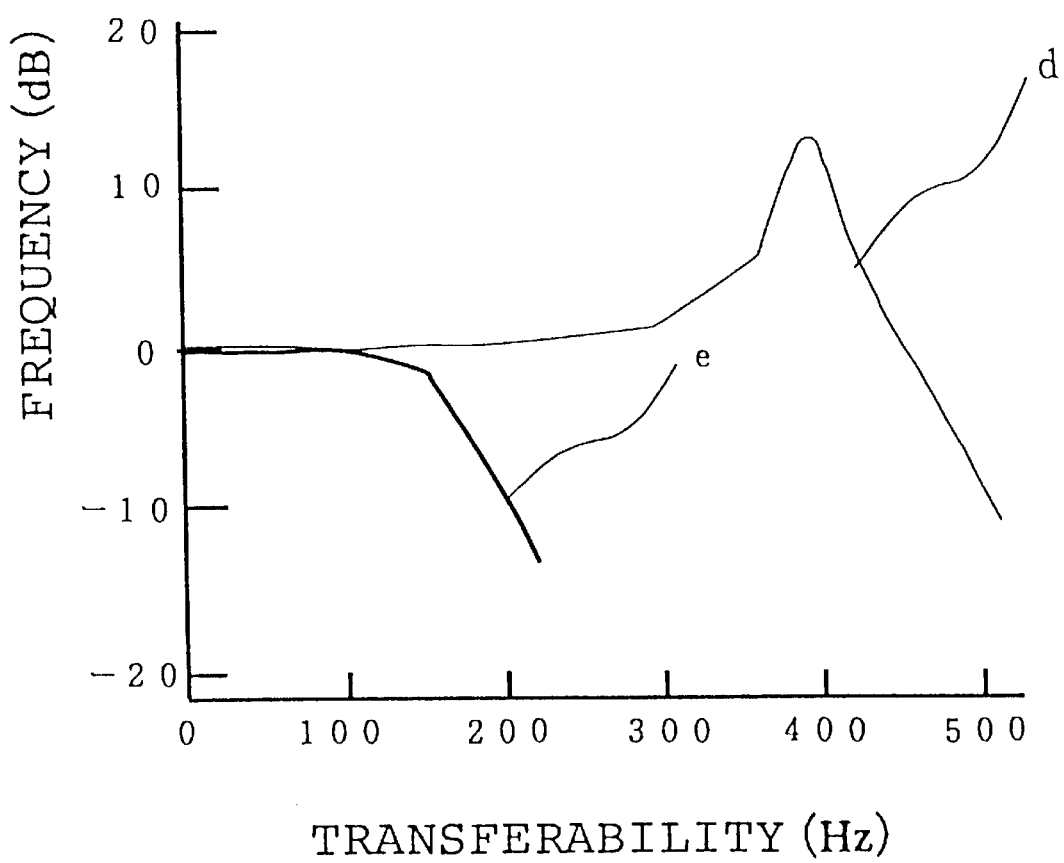
FIG. 24 is a frequency characteristic view of the semiconductor acceleration sensor manufactured by the fixing method using gel according to the present invention.

FIG. 24 shows the frequency characteristic obtained when the gel 70 is injected into the engagement portion. A line d indicates the case where the supporting body 9 is connected with the semiconductor substrate 11 without using the gel 70 at the engagement portion. The resonance point can be observed with the approximately 400 Hz. This characteristic may disadvantageously cause damage with the frequency at the resonance point. In this embodiment in which the gel 70 is used at the engagement portion for connecting the semiconductor substrate 11 according to the present invention with the supporting body 9, the characteristic represented by a line e was obtained by using the silicon gel 70. With the characteristic indicated by the line e, portions having the high transferability were eliminated and the frequency characteristic with which impact resistance can be achieved was obtained.

The method for covering the overall sensor with the gel 70 will now be described. FIG. 23 show the buffering method by which the overall sensor is covered with the gel 70. FIG. 23A is a top plan view, and FIG. 23B is a cross-sectional view. The sensor is mounted on a portion that is a supporting board of the lead frame 71, and the gel type substance is supplied by a dispenser. The gel 70 drips to cover the sensor. At this stage, the gel may have viscosity so as to cover the overall sensor. The resin mold is obtained by injection-molding such material and then packaged in FIG. 23C. The sensor is impact resistant because it is covered with the gel 70. In addition, since the package used in this embodiment is of a dip type and corresponds to a regular IC package, a user can easily use this package. FIG. 23C shows the side view of the sensor when molded.

Alcohol having a high flash point may be similarly used besides the silicon oil 48. As different from the oil, the alcohol can eliminate such a problem as that the peripheral portion is viscous and hard to be sealed when sealing.

With the above-mentioned processes, the structure in which the semiconductor substrate 11 that can be a sensor, the dead-weight 3 and the supposing body 9 are mounted on the supporting board was obtained (the acceleration sensor semiconductor device 101). Here, the structure is installed in the package and a means for weaken the impact resistance is applied thereto to obtain a sensor.

Embodiment 19

Prevention of leakage after injection of the silicon oil 48 will now be described.

After the silicon oil 48 is injected, the package must be plugged to prevent the silicon oil 48 from leaking. FIG. 25 shows this embodiment. Two holes are formed to the cover to function as an oil injection hole and an exhaust hole in FIG. 25A. The silicon oil 48 is injected by using a dispenser in FIG. 25B. Here, it is preferable not to inject a full amount of the silicon oil so as to make an air bank with taking into consideration expansion of the oil due to a change in temperature. In addition, there can be adopted a means such that a sponge is set in the package to prevent the silicon oil 48 from waving.

FIG. 25C shows the state where the oil is injected.

In this embodiment, lumps of indium are used as plugs for the package in FIG. 25D. Indium is a material apt to be deformed and used for maintaining airtightness, it is hence excellent for sealing. Any other material can be also used if it is suitable for sealing. Sealing is achieved by putting lumps of indium on the injection hole 81 and the exhaust hole 82 and applying pressure on these lamps in FIG. 25E. The sealing method by which pressure is applied to deform the material such as indium is easy and very convenient. Although the through holes are formed on the upper portion of the package in this embodiment, through holes may be formed to the supporting board 10. Note that a narrow portion must be provided as shown in FIG. 25D to prevent the sealing material from dropping because the straight shape of the through hole involves the sealing material to fall.

In addition, gold is provided around the holes by gold plating. The holes may be sealed by dropping the solder to these holes.

Embodiment 20

Although it is generally adopt resistance welding when bonding the cover of the package, ultrasonic waves may be used to achieve sealing. The engagement portion is heated and bonded when the ultrasonic waves are used. This method is very convenient. Note that boding can be easily made by friction heat if plastic is used to the package. Incidentally, soldering was used to achieve bonding in this embodiment.

Embodiment 21

The package is one of most important elements for maintaining the characteristic of the present sensor. When the sensor is mounted in a vehicle, the characteristic must be compensated at the temperature of not more than 125° C.

This problem can be usually solved by mounting a temperature compensating circuit, but the effect can be obtained by using heat insulating material to the package in this embodiment.

Embodiment 22

The sensor functions in response to outputs from the diffused resistors 4 of the semiconductor substrate 11, but the frequency characteristic or the offset voltage adjustment must be controlled. In this embodiment, the following control method was adopted.

In this embodiment, the semiconductor device having an adjustment function is provided in the vicinity of the sensor device as a device different from that having the sensor function. The semiconductor device having the adjustment function is called the signal processing IC.

The signal processing IC may includes a temperature compensating circuit, a trimming circuit for the offset adjustment or the like, an amplification circuit, a filter circuit and other circuits. A trimming circuit has functions of sensitivity adjustment, offset adjustment and temperature compensation. Further, another chip resistor may be used to the filter circuit.

Embodiment 23

Figure 26A:
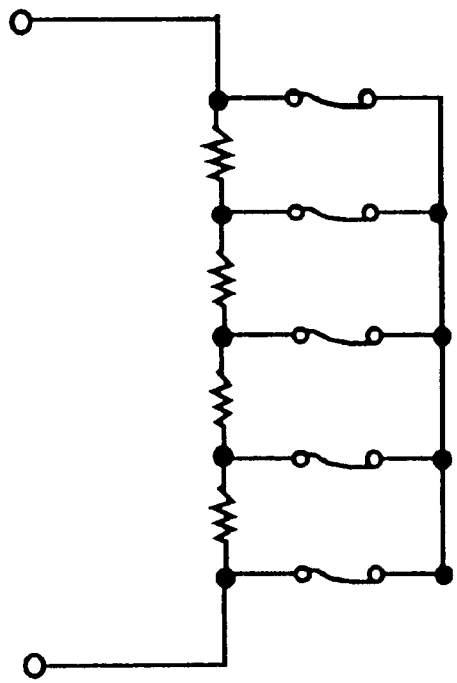
FIGS. 26A–26B are electric circuit diagrams showing a trimming circuit according to the present invention.
Figure 26B:
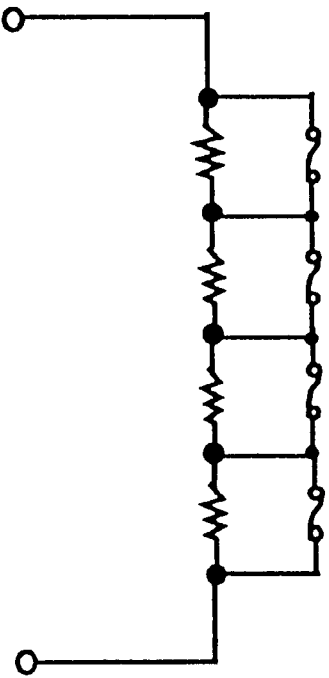

FIGS. 26A–26B show the trimming circuit. A circuit such as shown in FIG. 26B may be used. In case of the circuit shown in FIG. 26B, it is very convenient because trimming can be carried out in accordance with each resistor. For trimming, a laser beam is used and the wire is cut to function the resistors.

In case of the semiconductor acceleration sensor, when the semiconductor substrate 11 is fixed to the supporting body 9 and the dead-weight 3 is provided, the characteristic can be obtained for the first time. If such a device is used, it is necessary to carry out evaluation after manufacturing the structure and perform trimming in accordance with a result of evaluation. It is therefore preferable to produce the structure such that the package can pass the laser beam therethrough because trimming should be performed on the structure which is nearly finished. In general, since the laser beam is passed through by using glass, trimming is enabled. Note that portions to be trimmed must be previously determined according to measurement.

Embodiment 24

Figure 27:
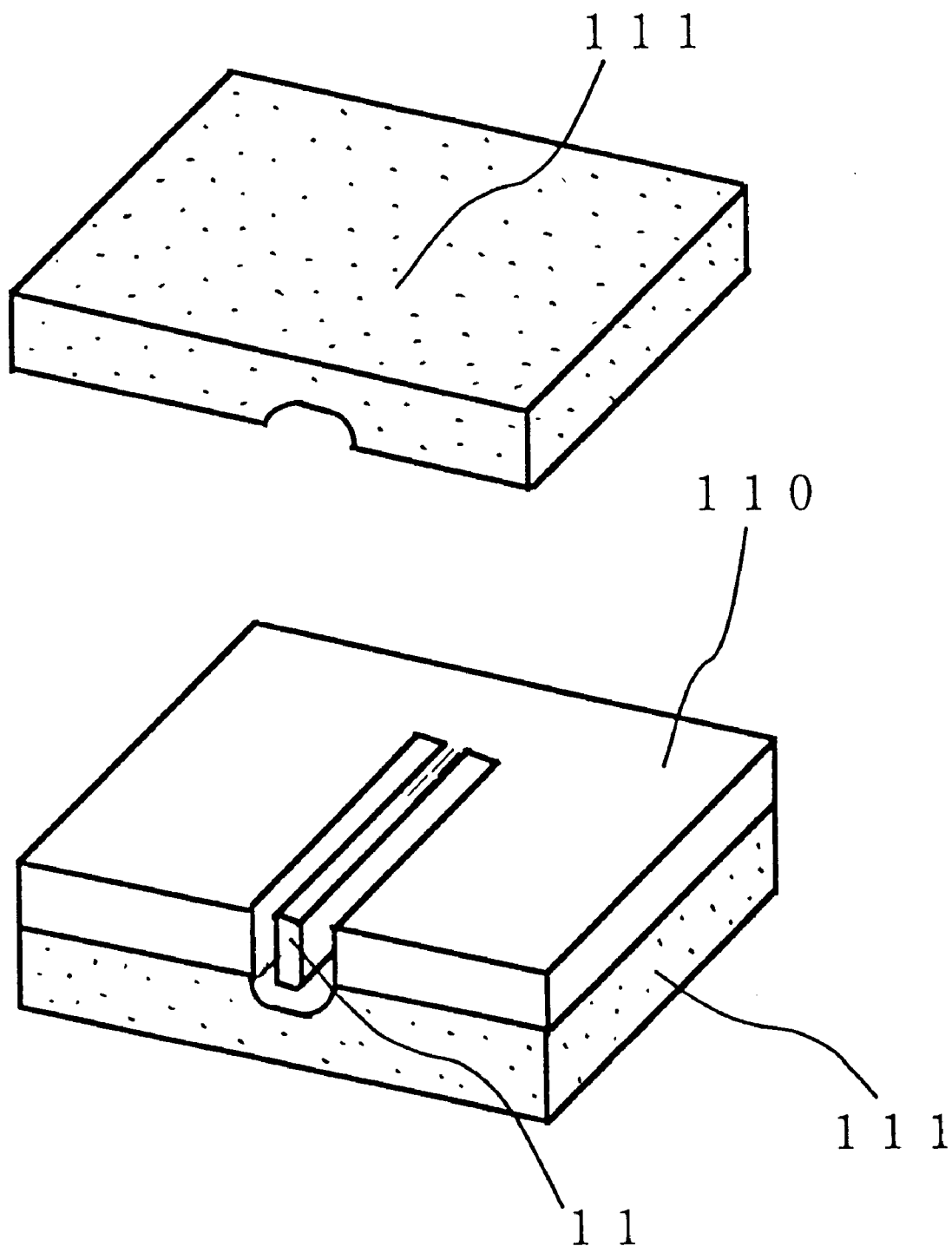
FIG. 27 is a perspective view showing one embodiment of the acceleration sensor according to the present invention.

In this embodiment, an example of the acceleration sensor attached to a microcomputer chip 110 will be explained. FIG. 27 shows a regular microcomputer chip 110, and a central portion of the microcomputer chip is cut out by a cutting process such as dicing and cutting is stopped in the vicinity of the diffused resistors without performing full cut. The acceleration sensor in which the portion near the diffused resistors is fixed can be produced by this method. The diffused resistors are provided on the illustrated-top face. In this method, the microcomputer chip and the stoppers 111 are also fixed after cutting as shown in the drawing.

Small gaps are preferably formed to the stoppers 111 so that the semiconductor substrate 11 can oscillate.

With the structure according to this embodiment, the semiconductor substrate 11 is brought into contact with a wall surface and stops even if an excessive acceleration is applied, it is hence impact resistant.

Parts other than the sensor portion were constituted by the microcomputer chip 110, and E2PROM and EPROM having the self-trimming function were used. Note that the dead-weight 3 may be provide on the side surface 100.

Since the microcomputer chip is included, the acceleration sensor has a programmable function and is used as a programmable acceleration sensor. If temperature information and others are stored in a memory, the temperature compensation function can be established by the self-trimming function.

Moreover, setting a programmable filter (analog) in the microcomputer chip can improve the frequency characteristic without using the silicon oil.

That is, all the functions can be realized on the chip, and an external AD conversion function is not required.

Embodiment 25

According to the present embodiment, the acceleration sensor including the microcomputer chip can be readily manufactured.

In case of dicing, it is difficult form a right angle at the edge because a rotary cutting blade is used.

Figure 28:
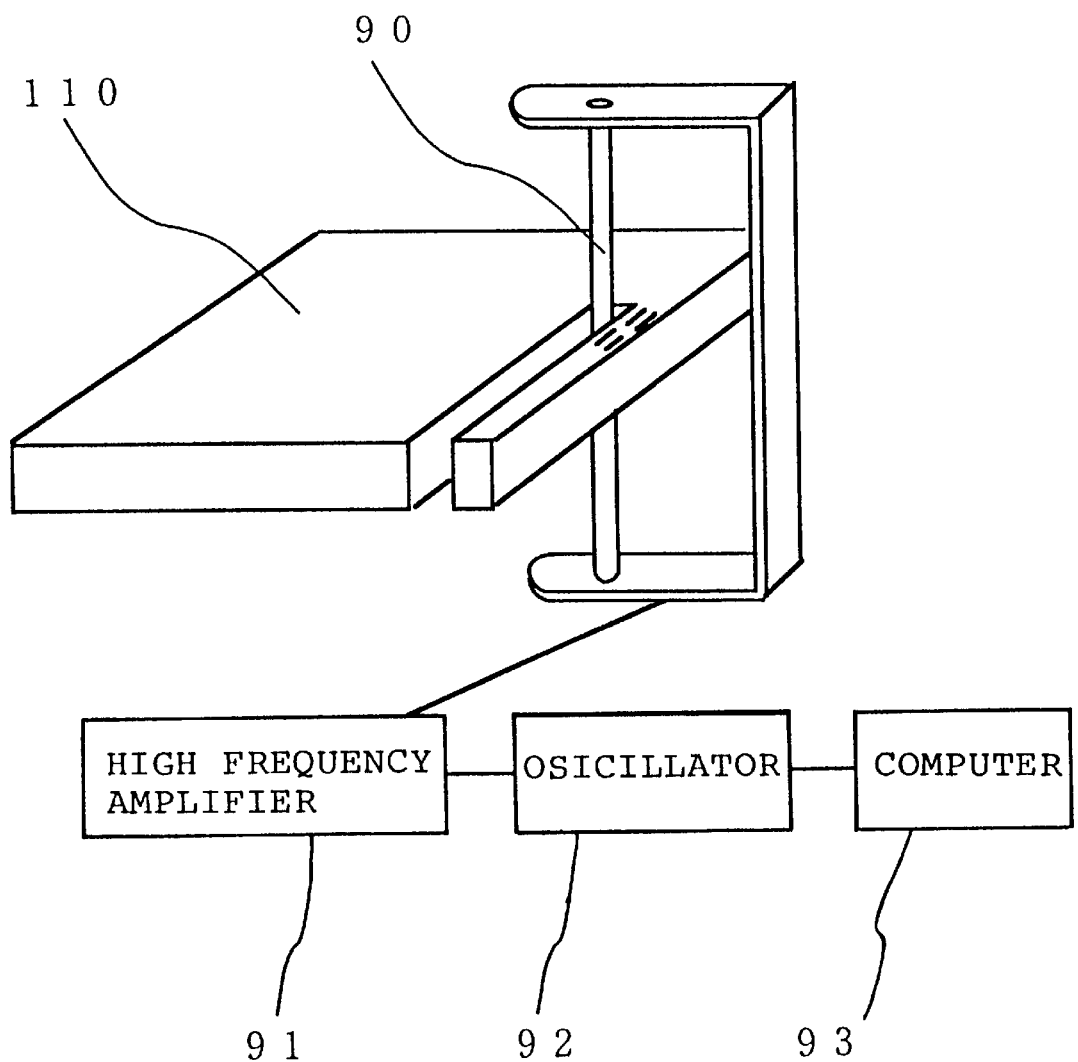
FIG. 28 is a perspective view showing one embodiment of a method for machining the acceleration sensor according to the present invention.

As another machining method, the plasma can be used. The principle will now be described in connection with FIG. 28. To a metal wire electrode 90 are connected a high frequency amplifier 91, an oscillator 92, and a computer 93. With this configuration, the plasma is produced around the metal wire electrode 90 to feed and control a piece to be machined. In this case, elimination reaction occurs only in the vicinity of the wire electrode, and the area to be machined is small. Further, since layers that are deformed in the machining are not generated, it is very effective. The plasma may be therefore used for taking out the rectangular parallelopiped type semiconductor substrate 11 according to the present invention.

As the principle of this technique, atoms having large electronegativity such as halogen are induced in a high frequency plasma which locally exist in the high pressure atmosphere and turned to neutral radical having higher reactivity to be reacted with the piece to be machined and converted into volatile substance for elimination processing. The excellent machined surface can be obtained because this is a method for carrying out machining in accordance with each atom.

There is reactive plasma etching as a method utilizing the plasma, but the machining is performed with low pressure of 10-3 Torr, thus decreasing the machining speed. In addition, spatial controllability for machining is not obtained. In the configuration shown in FIG. 28, the plasma that locally exists is spatially produced by using the high frequency with the pressure higher than the atmospheric pressure and high density radical is generated, thereby obtaining the machining speed and the spatial resolution for machining.

The end portion of the microcomputer chip 110 can be cut out according to the method utilizing the plasma as shown in the drawing, and only the end portion can be fixed without cutting. According to this method utilizing the plasma, the portion to be machined can be vertically cut, and the displacement caused due to the acceleration can be detected by the diffused resistors without problems.

Further, although the acceleration sensor is manufactured by machining only two edges thereof, only one edge may be processed. The plasma is produced to the metal wire electrode 90 and only one part was machined. In this method, the acceleration sensor can be easily manufactured.

Embodiment 26

Figure 29:
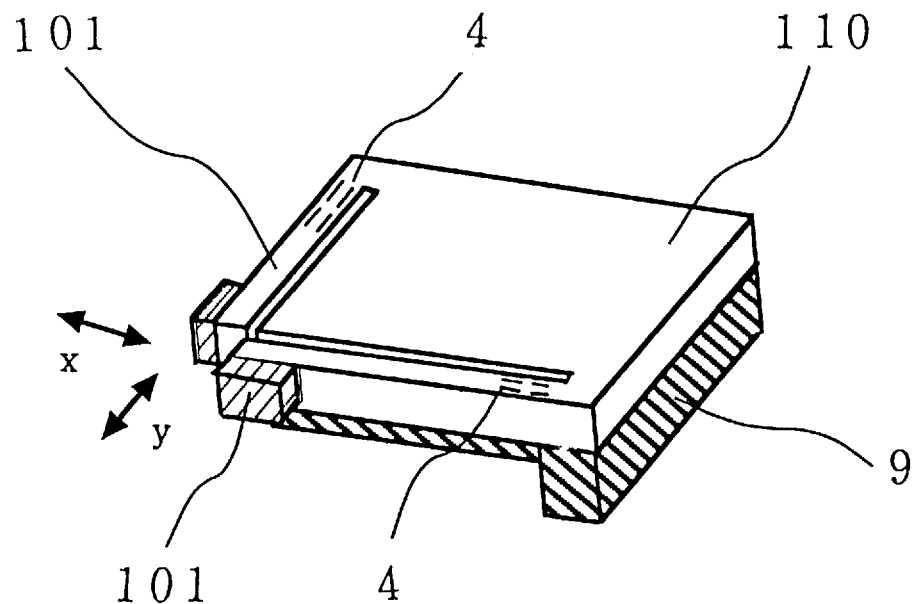
FIG. 29 is a perspective view showing one embodiment of a biaxial acceleration sensor according to the present invention.
Figure 30:
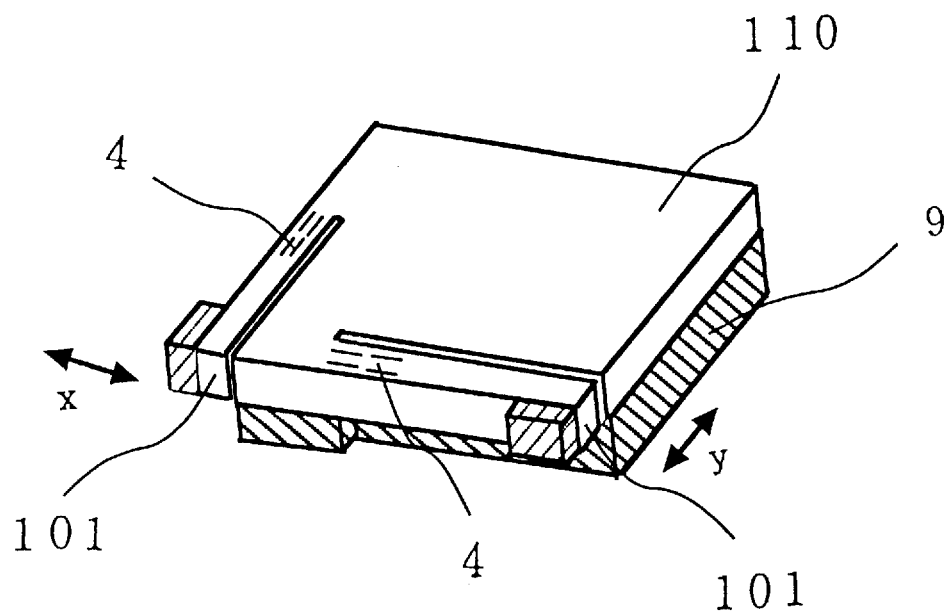
FIG. 30 is a perspective view showing one embodiment of the biaxial acceleration sensor according to the present invention.
Figure 31:
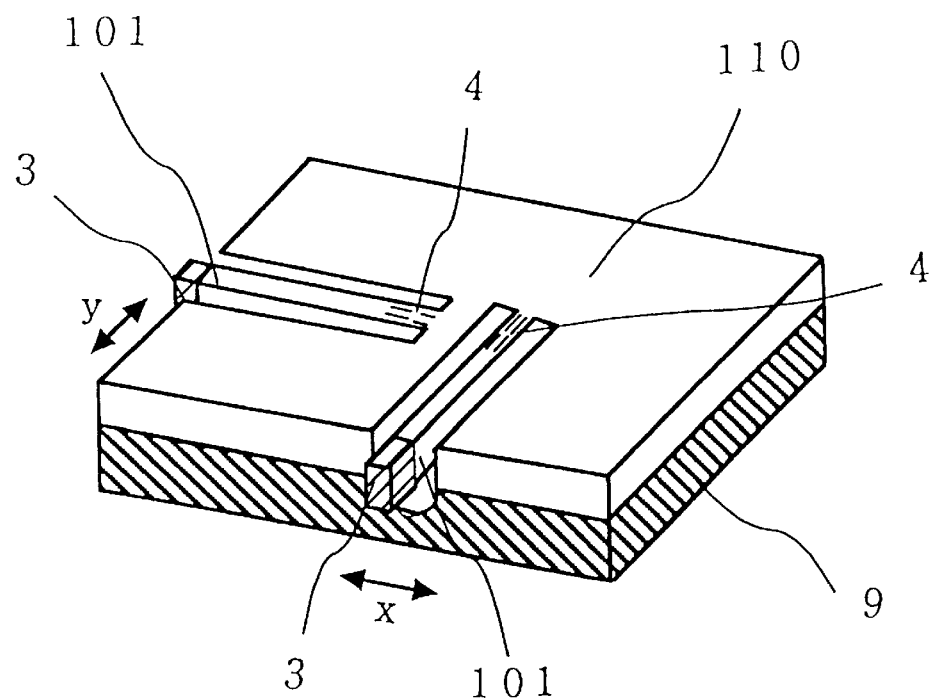
FIG. 31 is a perspective view showing one embodiment of the biaxial acceleration sensor according to the present invention.

The biaxial sensor such as shown in FIGS. 29, 30 and 31 can be realized by cutting the two-directional sensing at several positions.

In case of the sensor shown in FIGS. 29 and 30, two-directional sensor can be easily produced by the above-described method utilizing the plasma. Farther, referring to FIG. 31, two-directional acceleration can be detected by machining four sides of the sensor when a microcomputer chip 110 larger than that shown in FIGS. 29 and 30. In this method, the supporting body 9 is processed under the machined microcomputer chip as shown in the drawing so that the parts near the diffused resistors 4 are fixed and detection by the acceleration sensor device 101 is enabled. Note that the dead-weight is required and may be provided at a position of the center of gravity of the acceleration sensor device 101 from the outside as shown in FIGS. 29 and 30. In case of FIG. 31, the dead-weight may be provided at a tip of the acceleration sensor device 101.

Embodiment 27

Figure 32:
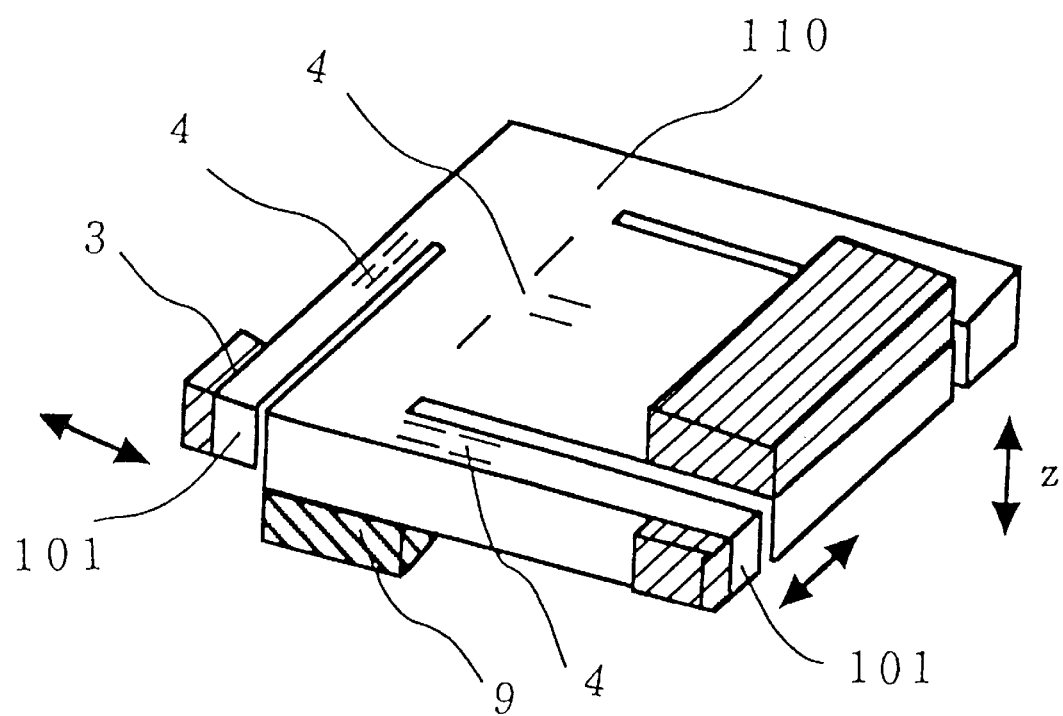
FIG. 32 is a perspective view showing one embodiment of a triaxial acceleration sensor according to the present invention.

Moreover, a triaxial acceleration sensor is possible when the present invention is applied. FIG. 32 shows the triaxial acceleration sensor according to the present invention. One side of sensor is further machined in addition to the above-described biaxial sensor, and the displacement control is performed with respect to the vertical acceleration in the drawing. The displacement in the Z axis in the drawing is detected. Detection of the triaxial acceleration was enabled with this configuration.

Embodiment 28

The semiconductor device having the semiconductor acceleration sensor according to the present invention demonstrates the very excellent characteristic in impact resistance because it has the detection portion that is not thin and has no narrow part as in the prior art. When the semiconductor device having the semiconductor acceleration sensor according to the present invention was used as an air bag operation sensor that is mounted on a vehicle to save life from collision of a vehicle, a predetermined characteristic was obtained and the device can be thus sufficiently used.

Additionally, the semiconductor acceleration sensor according to the present invention can be manufactured at a low price and has various applications. For example, in case of a pager or a portable telephone, it is general to inform an incoming call using sound or inform to turn off the switch by transmitting vibration to a human body, but impact is given by tapping on the pager or the portable telephone when the semiconductor acceleration sensor according to the present invention is used. The semiconductor acceleration sensor detects impact to turn off the switch of the device. With such a structure, the device can be easily stopped without manually turning off the switch. In the above-described configuration, the switch may be also turned on. For example, a desk lamp may be turned on when tapped.

The present invention has the following advantages with the above-mentioned structure.

(1) The front and back surfaces of the semiconductor acceleration sensor having the diffused resistor portion is flat and the diffused resistor portion is not made thin, thereby readily manufacturing the device. The complicated processes are not required. Further, the device is impact resistant.

(2) Since the thin portion is not required in the diffused resistor portion, the manufacturing time can be reduced, which leads to the low price.

(3) The device having good accuracy can be supplied.

(4) The inexpensive acceleration sensor can be supplied because a plurality of acceleration semiconductor substrates can be obtained from a semiconductor wafer.

(5) Improvement of the yield or manufacturing processes can be facilitated by taking into consideration arrangement of a plurality of bridge circuits.

(6) Since the structure is a rectangular parallelopiped, manufacturing facilities can easily deal with this structure.

What is claimed is:

1. A semiconductor acceleration sensor comprising: a rectangular parallelepiped shaped structure formed from a semiconductor wafer and having a first surface for receiving an acceleration force during use of the sensor, a second surface disposed generally orthogonal to the first surface, and strain sensing portions disposed on the second surface symmetrically with respect to a center of the second surface in the longitudinal direction of the rectangular parallelepiped shaped structure; a supporting body for fixing and supporting the rectangular parallelepiped shaped structure; and a plurality of bridge circuits disposed on the second surface of the rectangular parallelepiped shaped structure, each of the bridge circuits having a plurality of the strain sensing portions.

2. A semiconductor acceleration sensor as set forth in claim 1; wherein the strain sensing portions comprise diffused resistors; and wherein the bridge circuits include the diffused resistors.

3. A semiconductor acceleration sensor as set forth in claim 2; wherein an end of the supporting body is disposed in the vicinity of the diffused resistors of a preselected one of the bridge circuits.

4. A semiconductor acceleration sensor as set forth in claim 1; wherein the supporting body is disposed on one of the surfaces of the rectangular parallelepiped shaped structure; and wherein a dead-weight is disposed on a surface of the rectangular parallelepiped shaped structure opposite to the surface on which the supporting body is disposed.

5. A semiconductor acceleration sensor as set forth in claim 1; wherein the supporting body is disposed on a third surface of the rectangular parallelepiped shaped structure disposed opposite the first surface and generally orthogonal to the second surface.

6. A semiconductor acceleration sensor as set forth in claim 5; wherein a dead-weight is disposed on the first surface of the rectangular parallelepiped shaped structure.

7. A semiconductor acceleration sensor as set forth in claim 1; wherein the second surface of the rectangular parallelepiped shaped structure corresponds to a thickness of the rectangular parallelepiped shaped structure.

8. A semiconductor acceleration sensor as set forth in claim 7; wherein the supporting body is disposed on a third surface of the rectangular parallelepiped shaped structure disposed opposite the first surface and generally orthogonal to the second surface; and wherein a dead-weight is disposed on the first surface of the rectangular parallelepiped shaped structure.

9. A semiconductor acceleration sensor as set forth in claim 1; wherein the second surface of the rectangular parallelepiped shaped structure is positioned so as not to receive an acceleration force during use of the sensor.

10. A semiconductor acceleration sensor comprising: a cantilever formed from a semiconductor wafer and having a first surface for receiving an acceleration force during use of the sensor, a second surface disposed generally orthogonal to the first surface, and strain sensing portions disposed on the second surface symmetrically with respect to a center of the second surface in the longitudinal direction of the cantilever; and a supporting body for supporting the cantilever.

11. A semiconductor acceleration sensor as set forth in claim 10; further comprising a plurality of bridge circuits disposed on the second surface of the cantilever, each of the bridge circuits having a plurality of the strain sensing portions.

12. A semiconductor acceleration sensor as set forth in claim 11; wherein the strain sensing portions comprise diffused resistors; and wherein the bridge circuits include the diffused resistors.

13. A semiconductor acceleration sensor as set forth in claim 12; wherein an end of the supporting body is disposed in the vicinity of the diffused resistors of a preselected one of the bridge circuits.

14. A semiconductor acceleration sensor as set forth in claim 10; wherein the supporting body is disposed on a third surface of the cantilever disposed opposite the first surface and generally orthogonal to the second surface.

15. A semiconductor acceleration sensor as set forth in claim 14; wherein a dead-weight is disposed on the first surface of the cantilever.

16. A semiconductor acceleration sensor as set forth in claim 10; wherein the second surface of the cantilever corresponds to a thickness of the cantilever.

17. A semiconductor acceleration sensor as set forth in claim 10; wherein the second surface of the rectangular parallelepiped shaped structure is positioned so as not to receive an acceleration force during use of the sensor.

* * * * *